United States Patent
Imada

(10) Patent No.: US 9,312,373 B2
(45) Date of Patent: Apr. 12, 2016

(54) COMPOUND SEMICONDUCTOR DEVICE AND MANUFACTURING METHOD OF THE SAME

(71) Applicant: FUJITSU LIMITED, Kawasaki (JP)

(72) Inventor: Tadahiro Imada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/740,535

(22) Filed: Jan. 14, 2013

(65) Prior Publication Data

US 2013/0126897 A1    May 23, 2013

Related U.S. Application Data

(63) Continuation of application No. PCT/JP2010/061902, filed on Jul. 14, 2010.

(51) Int. Cl.
*H01L 29/66* (2006.01)
*H01L 29/872* (2006.01)
(Continued)

(52) U.S. Cl.
CPC .......... *H01L 29/778* (2013.01); *H01L 27/0605* (2013.01); *H01L 29/0653* (2013.01);
(Continued)

(58) Field of Classification Search
CPC . H01L 29/778; H01L 29/66431; H01L 29/66; H01L 29/812; H01L 29/861; H01L 29/872; H01L 29/737; H01L 29/78; H01L 29/20; H01L 29/40; H01L 29/205; H01L 29/24; H01L 29/12; H01L 29/94
USPC .......... 257/76, 194, 473, 183, 330, 195, 201, 257/192, 285
See application file for complete search history.

(56) References Cited

U.S. PATENT DOCUMENTS 5,436,474 A    7/1995    Banerjee et al.
6,373,098 B1    4/2002    Brush
(Continued)

FOREIGN PATENT DOCUMENTS

EP    1 835 544 A2    9/2007
JP    2000-349092    12/2000
(Continued)

OTHER PUBLICATIONS

H. Otake, et al.; "Vertical GAN-Based Trench Gate Metal Oxide Semiconductor Field-Effect Transistors on GaN Bulk Substrates;" Applied Physics Express 1; 2008; pp. 01105-1-01105-3 (3 Sheets)/p. 3 of specification.
(Continued)

*Primary Examiner* — Chuong A Luu
(74) *Attorney, Agent, or Firm* — Kratz, Quintos & Hanson, LLP

(57) ABSTRACT

An electrode (109) insulated from a compound semiconductor layer (102) and being in contact with an electrode (101) and a compound semiconductor layer (103) is provided. A lattice constant of the compound semiconductor layer (103) is smaller than both of a lattice constant of the compound semiconductor layer (102) and a lattice constant of a compound semiconductor layer (104), and a lattice constant of a compound semiconductor layer (107) is smaller than both of the lattice constants of the compound semiconductor layer (102) and the lattice constants of the compound semiconductor layer (104). A conduction band energy of the compound semiconductor layer (103) is higher than a conduction band energy of the compound semiconductor layer (104).

12 Claims, 23 Drawing Sheets

(51) Int. Cl.
*H01L 29/778* (2006.01)
*H01L 27/06* (2006.01)
*H01L 29/06* (2006.01)
*H01L 29/20* (2006.01)
*H01L 29/205* (2006.01)

(52) U.S. Cl.
CPC .......... *H01L29/2003* (2013.01); *H01L 29/205* (2013.01); *H01L 29/66431* (2013.01); *H01L 29/66462* (2013.01); *H01L 29/7788* (2013.01); *H01L 29/7789* (2013.01)

(56) References Cited

U.S. PATENT DOCUMENTS

| | | | |
|---|---|---|---|
| 6,768,146 | B2 | 7/2004 | Yoshida |
| 7,538,718 | B2 | 5/2009 | Ikeda |
| 7,592,647 | B2 | 9/2009 | Nakata |
| 7,838,907 | B2 | 11/2010 | Shiraishi |
| 8,044,434 | B2 | 10/2011 | Ohta |
| 2003/0098462 | A1 | 5/2003 | Yoshida |
| 2006/0220060 | A1 | 10/2006 | Nakata |
| 2008/0079009 | A1* | 4/2008 | Yaegashi .................. 257/77 |
| 2008/0180313 | A1 | 7/2008 | Ikeda |
| 2008/0237605 | A1 | 10/2008 | Murata et al. |
| 2008/0315257 | A1 | 12/2008 | Shiraishi |
| 2009/0166677 | A1 | 7/2009 | Shibata |
| 2009/0179227 | A1* | 7/2009 | Otake et al. .................. 257/192 |
| 2009/0230433 | A1 | 9/2009 | Yamaguchi |
| 2009/0283776 | A1 | 11/2009 | Iwamuro |
| 2009/0321854 | A1 | 12/2009 | Ohta et al. |
| 2010/0006894 | A1* | 1/2010 | Ohta et al. .................. 257/192 |
| 2010/0019250 | A1 | 1/2010 | Nakamura et al. |
| 2010/0025730 | A1 | 2/2010 | Heikman et al. |
| 2011/0006345 | A1 | 1/2011 | Ota et al. |
| 2012/0086015 | A1* | 4/2012 | Kyono et al. .................. 257/76 |
| 2013/0099286 | A1* | 4/2013 | Imada .......................... 257/194 |

FOREIGN PATENT DOCUMENTS

| | | |
|---|---|---|
| JP | 2003-229566 A1 | 8/2003 |
| JP | 2005-26242 A1 | 1/2005 |
| JP | 2006-286942 A1 | 10/2006 |
| JP | 2008-026901 A1 | 2/2008 |
| JP | 2008-53449 A1 | 3/2008 |
| JP | 2008-91595 A1 | 4/2008 |
| JP | 2008-192701 A1 | 8/2008 |
| JP | 2008-209382 A1 | 9/2008 |
| JP | 2008-235613 A1 | 10/2008 |
| JP | 2009-4398 A1 | 1/2009 |
| JP | 2009-164158 A1 | 7/2009 |
| WO | 2009/110254 A1 | 9/2009 |

OTHER PUBLICATIONS

M. Kodama, et al.; "GaN-Based Trench Gate Metal Oxide Semiconductor Field-Effect Transistor Fabricated with Novel Wet Etching;" Applied Physics Express 1; 2008; pp. 021104-1-021104 (3 Sheets)/p. 3 of specification.
International Search Report for International Application No. PCT/JP2010/061902 dated Oct. 12, 2010.
Extended European Search Report dated Mar. 19, 2014 in the corresponding European patent application No. 10854711.8.
International Preliminary Report on Patentability issued Feb. 21, 2013 in counterpart application No. PCT/JP2010/061902 (7 pages).
Office Action of U.S. Appl. No. 14/812,643 dated Aug. 21, 2015.

* cited by examiner

COMPOUND SEMICONDUCTOR DEVICE AND MANUFACTURING METHOD OF THE SAME

CROSS-REFERENCE TO RELATED APPLICATION

This application is a continuation application of International Application PCT/JP2010/061902 filed on Jul. 14, 2010 and designated the U.S., the entire contents of which are incorporated herein by reference.

FIELD

The present invention relates to a compound semiconductor device and a manufacturing method of the same.

BACKGROUND

Conventionally, studies have been conducted on a high electron mobility, transistor (HEMT) having an AlGaN layer and a GaN layer formed by crystal growth over a substrate, in which the GaN layer functions as an electron transit layer. The band gap of GaN is 3.4 eV, which is wider than the band gap of Si (1.1 eV) and the band gap of GaAs (1.4 eV). Accordingly, the GaN-based HEMT has high breakdown voltage, and is promising as a high breakdown voltage power device for automobiles or the like.

On the other hand, a body diode exists inevitably in an Si-based field effect transistor. The body diode is connected to a transistor to be in inversely parallel to the transistor, and functions as a free wheel diode in a full-bridge circuit method used for a high-power power supply. However, in the GaN-based HEMT, such a body diode does not exist inevitably. Accordingly, there has been proposed a structure in which a pn junction diode, which has a p-type layer and an n-type layer stacked in a thickness direction of the substrate, is connected to the GaN-based HEMT.

However, in the structure which has been proposed, a delay easily occurs in operation of the diode. Then, accompanying the delay, inverse electric current flows in the HEMT before the diode operates as the free wheel diode, and the power consumption increases. Further, when overvoltage is applied between the source and the drain of the HEMT due to the delay, the diode does not operate as a protective circuit.

There are a horizontal structure, in which a source and a drain are disposed in parallel to a surface of a substrate, and a vertical structure, in which a source and a drain are disposed vertically to a surface of a substrate, in structures of the high breakdown voltage power device. A current path is three-dimensional in the vertical structure, and therefore, a current amount per one chip is larger than the horizontal structure. Besides, the source electrode and the drain electrode are formed at a front surface and a rear surface of a substrate in the vertical structure, and therefore, an area required for the source electrode and the drain electrode is smaller than that of the horizontal structure, in which these electrodes are formed only at a front surface of a substrate. Further, a ratio of the electrodes per one chip in the vertical structure is larger than that of the horizontal structure, and therefore, a heat releasing property thereof is higher. Accordingly, practical use of the high breakdown voltage power device in the vertical structure is expected.

However, it is difficult to connect the above-stated pn junction diode to the GaN based HEMT in the vertical structure. Also, the above-stated problems are not solved even if the pn junction diode may be connected.

Patent Literature 1: Japanese Laid-open Patent Publication No. 2009-164158
Patent Literature 2: Japanese Laid-open Patent Publication No. 2009-4398
Non Patent Literature 1: Applied Physics Express 1 (2008) 011105
Non Patent Literature 2: Applied Physics Express 1 (2008) 021104

SUMMARY

According to an aspect of the embodiments, a compound semiconductor device includes: a first electrode; a first compound semiconductor layer formed over the first electrode; a second compound semiconductor layer formed on the first compound semiconductor layer; a third compound semiconductor layer formed on the second compound semiconductor layer; a second electrode formed over the third compound semiconductor layer. The compound semiconductor device further includes a fourth compound semiconductor layer formed in an opening formed in a stack of the first compound semiconductor layer, the second compound semiconductor layer and the third compound semiconductor layer, the fourth compound semiconductor layer being in contact with side surfaces of the first compound semiconductor layer, the second compound semiconductor layer and the third compound semiconductor layer, and the side surfaces facing to the opening; a gate electrode that controls an electric potential of an interface between the second compound semiconductor layer and the fourth compound semiconductor layer; and a third electrode insulated from the first compound semiconductor layer, the third electrode being in contact with the first electrode and the second compound semiconductor layer. A lattice constant of the second compound semiconductor layer is smaller than both of a lattice constant of the first compound semiconductor layer and a lattice constant of the third compound semiconductor layer, and a lattice constant of the fourth compound semiconductor layer is smaller than both of the lattice constant of the first compound semiconductor layer and the lattice constant of the third compound semiconductor layer. A conduction band energy of the second compound semiconductor layer is higher than a conduction band energy of the third compound semiconductor layer.

ADVANTAGEOUS EFFECTS OF INVENTION

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments are concretely described with reference to the attached drawings.

(First Embodiment)

Figure 1A:
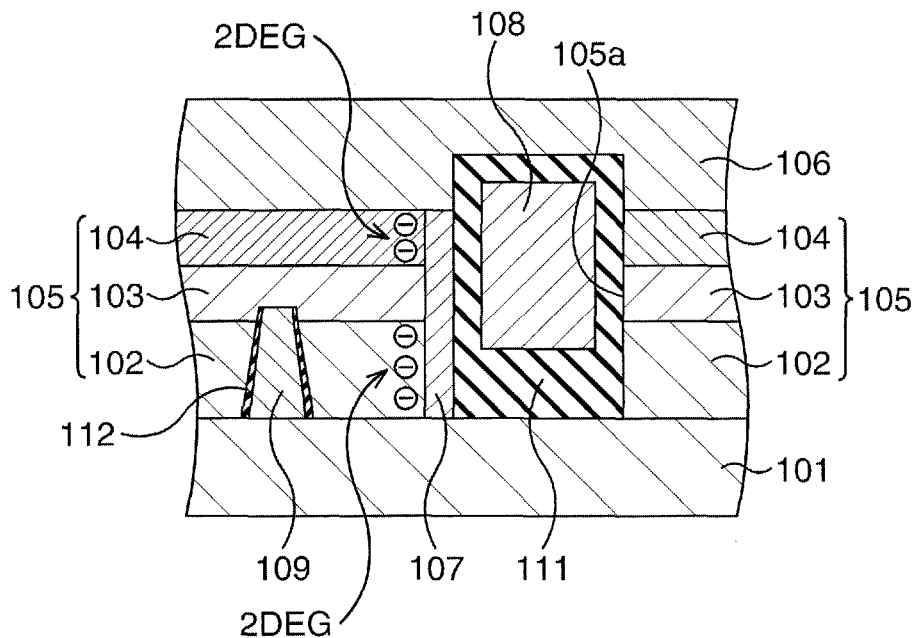
FIG. 1A is a sectional view illustrating a structure of a compound semiconductor device according to a first embodiment.
Figure 1B:
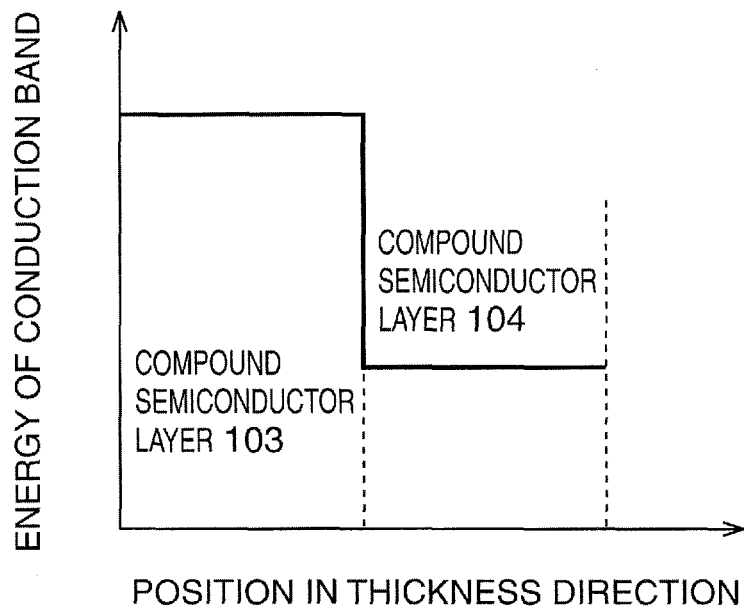
FIG. 1B is a view representing a conduction band energy in the first embodiment.

First, a first embodiment is described. FIG. 1A is a sectional view illustrating a structure of a compound semiconductor device according to the first embodiment, and FIG. 1B is a view illustrating a conduction band energy according to the first embodiment.

In the first embodiment, a compound semiconductor layer 102, a compound semiconductor layer 103, and a compound semiconductor layer 104 are formed over a drain electrode 101 in this sequence. A stack 105 includes the compound semiconductor layers 102 to 104, and an opening 105a is formed in the stack 105. A compound semiconductor layer 107 which is in contact with side surfaces of the compound semiconductor layers 102 to 104 is formed in the opening 105a, to which the side surfaces face to. A gate electrode 108 is also formed in the opening 105a. The gate electrode 108 is enclosed by an insulating film 111. Accordingly, the gate electrode 108 is insulated from the drain electrode 101, the compound semiconductor layer 107, and so on. Further, a source electrode 106 is formed over the compound semiconductor layer 104. The source electrode 106 is insulated from the gate electrode 108 by the insulating film 111.

Moreover, in the present embodiment, an electrode 109 insulated from the compound semiconductor layer 102 by an insulating film 112 is formed in the compound semiconductor layer 102. The electrode 109 is in contact with the drain electrode 101 and the compound semiconductor layer 103.

Note that a lattice constant of the compound semiconductor layer 103 is smaller than both of a lattice constant of the compound semiconductor layer 102 and a lattice constant of the compound semiconductor layer 104. Moreover, a lattice constant of the compound semiconductor layer 107 is smaller than both of the lattice constant of the compound semiconductor layer 102 and the lattice constant of the compound semiconductor layer 104. Accordingly, distortion resulting from a difference between the lattice constants of the compound semiconductor layer 102 and the compound semiconductor layer 107 is generated in the compound semiconductor layer 107. Similarly, distortion resulting from a difference between the lattice constants of the compound semiconductor layer 104 and the compound semiconductor layer 107 is generated in the compound semiconductor layer 107. A piezoelectric polarization and a spontaneous polarization occur resulting from these distortions, and two-dimensional electron gas (2DEG) is generated in a vicinity of interfaces between the compound semiconductor layers 102, 104 and the compound semiconductor layer 107. The 2DEG is electron gas with high electron density and high electron mobility. Accordingly, a current flowing between the source electrode 106 and the drain electrode 101 changes in accordance with an electric potential at the interface between the compound semiconductor layer 103 and the compound semiconductor layer 107. The gate electrode 108 controls the electric potential at the interface.

As stated above, an HEMT in a vertical structure is included in the first embodiment. Note that an electrode 109 is formed apart from the above-stated 2DEG.

Note that the 2DEG is seldom generated in a vicinity of the interface of the compound semiconductor layer 103 with the compound semiconductor layer 107 due to the relationship of the above-described lattice constants. Accordingly, the HEMT in the vertical structure performs a normally-off operation. It is preferable that the lattice constant of the compound semiconductor layer 103 is equal to or less than the lattice constant of the compound semiconductor layer 107 to more surely suppress the generation of the 2DEG in the vicinity of the interface.

Besides, in the first embodiment, a conduction band energy of the compound semiconductor layer 103 is higher than a conduction band energy of the compound semiconductor layer 104, as illustrated in FIG. 1B. The drain electrode 101 is connected to the compound semiconductor layer 103 via the electrode 109, and the source electrode 106 is connected to the compound semiconductor layer 104.

Accordingly, when a negative voltage is applied to the drain electrode 101, electrons move from the drain electrode 101 to the source electrode 106 through the compound semiconductor layers 103 and 104, and a current flows from the source electrode 106 to the drain electrode 101. Namely, a function of a free wheel diode can be obtained. Moreover, the electrode 109 is in contact with the drain electrode 101 and the compound semiconductor layer 103, the source electrode 106 is in contact with the compound semiconductor layer 104, and therefore, the free wheel diode operates before a large current flows in the HEMT. Accordingly, an increase of power consumption can be suppressed. When a positive large voltage is applied to the drain electrode 101, the electrons move from the source electrode 106 to the drain electrode 101 through the compound semiconductor layers 104 and 103, and a current flows from the drain electrode 101 to the source electrode 106. Namely, a function of a protective diode can be obtained. Accordingly, it is possible to prevent a trouble of the HEMT.

Next, examples of materials of the compound semiconductor layers 102 to 104, and 107 are described.

"Combination of GaN and AlGaN"

As for GaN and AlGaN, a lattice constant of AlGaN is smaller than a lattice constant of GaN, and an conduction band energy of AlGaN is higher than a conduction band energy of GaN. Accordingly, GaN layers may be used for the compound semiconductor layers 102 and 104, and AlGaN layers may be used for the compound semiconductor layers 103 and 107. Note that an n$^+$GaN layer containing a high concentration n-type impurity may be provided at a surface of the compound semiconductor layer 104 so as to reduce a contact resistance with the source electrode 106.

In the combination as stated above, the high electron density and high electron mobility 2DEG is generated in the vicinity of the interfaces of the compound semiconductor layers 102 and 104 with the compound semiconductor layer 107 resulting from the difference of the lattice constants between GaN and AlGaN. Besides, when ratios of Al (composition fraction of Al) each relative to a total amount of Al and Ga between the compound semiconductor layer 103 and the compound semiconductor layer 107 are the same, the lattice constants of these are also the same, and the 2DEG is not generated in the vicinity of the interface.

Further, the compound semiconductor layers 103 and 104 are able to function as the free wheel diode and the protective diode resulting from the difference of the conduction band energies between GaN and AlGaN.

"Combination of InAlN and AlN"

As for InAlN and AlN, a lattice constant of AlN is smaller than a lattice constant of InAlN, and a conduction band energy of AlN is higher than a conduction band energy of InAlN. Accordingly, InAlN layers may be used for the compound semiconductor layers 102 and 104, and AlN layers may be used for the compound semiconductor layers 103 and 107. Note that an n$^+$InAlN layer containing a high concentration n-type impurity may be provided at a surface of the compound semiconductor layer 104 so as to reduce a contact resistance with the source electrode 106.

In the combination as stated above, the high electron density and high electron mobility 2DEG is generated in the vicinity of the interfaces of the compound semiconductor layers 102 and 104 with the compound semiconductor layer 107 resulting from the difference of the lattice constants between InAlN and AlN. Besides, the lattice constants may be the same between the compound semiconductor layer 103 and the compound semiconductor layer 107, and the 2DEG may not be generated in the vicinity of the interface of these layers 103 and 107.

Further, the compound semiconductor layers 103 and 104 are able to function as the free wheel diode and the protective diode resulting from the difference of the conduction band energies between InAlN and AlN.

"Combination of InAlGaN and AlN"

As for InAlGaN and AlN, the lattice constant of AlN is smaller than a lattice constant of InAlGaN, and the conduction band energy of AlN is higher than a conduction band energy of InAlGaN. Accordingly, InAlGaN layers may be used for the compound semiconductor layers 102 and 104, and the AlN layers may be used for the compound semiconductor layers 103 and 107. Note that an n$^+$InAlGaN layer containing a high concentration n-type impurity may be provided at a surface of the compound semiconductor layer 104 so as to reduce a contact resistance with the source electrode 106.

In the combination as stated above, the high electron density and high electron mobility 2DEG is generated in the vicinity of the interfaces of the compound semiconductor layers 102 and 104 with the compound semiconductor layer 107 resulting from the difference of the lattice constants between InAlGaN and AlN. Besides, the lattice constants may be the same between the compound semiconductor layer 103 and the compound semiconductor layer 107, and the 2DEG may not be generated in the vicinity of the interface of these layers 103 and 107.

Further, the compound semiconductor layers 103, 104 are able to function as the free wheel diode and the protective diode resulting from a difference of the conduction band energies between InAlGaN and AlN.

"Combination of InAlN and InAlGaN"

As for InAlN and InAlGaN, magnitude relations of the lattice constants and the conduction band energies change in accordance with a ratio of each element (a composition fraction of each element) relative to a total amount of In, Al, and Ga contained thereto. Namely, it is possible to make the lattice constant of InAlN smaller than that of InAlGaN, and to make the conduction band energy of InAlN higher than that of InAlGaN by adjusting the composition fractions of these compound semiconductors. Conversely, it is also possible to make the lattice constant of InAlGaN smaller than the lattice constant of InAlN, and to make the conduction band energy of InAlGaN higher than that of InAlN by adjusting the composition fractions of these compound semiconductors. When the lattice constant of InAlGaN is made smaller than that of InAlN, and the conduction band energy of InAlGaN is made higher than that of InAlN, the InAlN layers may be used for the compound semiconductor layers 102 and 104, and InAlGaN layers may be used for the compound semiconductor layers 103 and 107. Note that an n$^+$InAlN layer containing a high concentration n-type impurity may be provided at a surface of the compound semiconductor layer 104 so as to reduce the contact resistance with the source electrode 106.

In the combination as stated above, the high electron density and high electron mobility 2DEG is generated in the vicinity of the interface of the compound semiconductor layers 102 and 104 with the compound semiconductor layer 107 resulting from the difference of the lattice constants between InAlN and InAlGaN. Besides, when respective composition fractions of In, Al and Ga are the same between the compound semiconductor layer 103 and the compound semiconductor layer 107, the lattice constants of these are the same, and the 2DEG is not generated in the vicinity of the interface.

Further, the compound semiconductor layers 103 and 104 are able to function as the free wheel diode and the protective diode resulting from the difference of the conduction band energies between InAlN and InAlGaN.

"Combination of Two Kinds of AlGaN of which Al Composition Fractions are Different"

The lattice constants and the conduction band energies may be different if the composition fractions thereof are different, even though the kinds of elements are the same. For example, the lattice constant is small and the conduction band energy is high as the composition fraction of Al is higher in AlGaN. Accordingly, it is possible to apply a combination of $Al_{0.3}Ga_{0.7}N$ and $Al_{0.5}Ga_{0.5}N$, for example, as a combination of the compound semiconductors of which lattice constants and the conduction band energies are different. In this case, $Al_{0.3}Ga_{0.7}N$ layers, of which Al composition fraction is lower, are used for the compound semiconductor layers 102 and 104, and $Al_{0.5}Ga_{0.5}N$ layers, of which Al composition fraction is higher, may be used for the compound semiconductor layers 103 and 107. Note that an n$^+$$Al_{0.3}Ga_{0.7}N$ layer containing a high concentration n-type impurity may be provided at a surface of the compound semiconductor layer 104 so as to reduce a contact resistance with the source electrode 106.

In the combination as stated above, the high electron density and high electron mobility 2DEG is generated in the vicinity of the interfaces of the compound semiconductor layers 102 and 104 with the compound semiconductor layer 107 resulting from the difference of the lattice constants between $Al_{0.3}Ga_{0.7}N$ and $Al_{0.5}Ga_{0.5}N$. Besides, the lattice constants may be the same between the compound semiconductor layer 103 and the compound semiconductor layer 107, and the 2DEG may not be generated in the vicinity of the interface thereof.

Further, the compound semiconductor layers 103 and 104 are able to function as the free wheel diode and the protective diode resulting from a difference of the conduction band energies between $Al_{0.3}Ga_{0.7}N$ and $Al_{0.5}Ga_{0.5}N$.

Note that two kinds of InAlN of which composition ratios of In and Al are different may be used and two kinds of InAlGaN of which composition ratios of In, Al and Ga are different may be used instead of the above-stated two kinds of AlGaN.

"Compound Semiconductor Layer 103 including Plural Kinds of Compound Semiconductors"

Figure 1C:
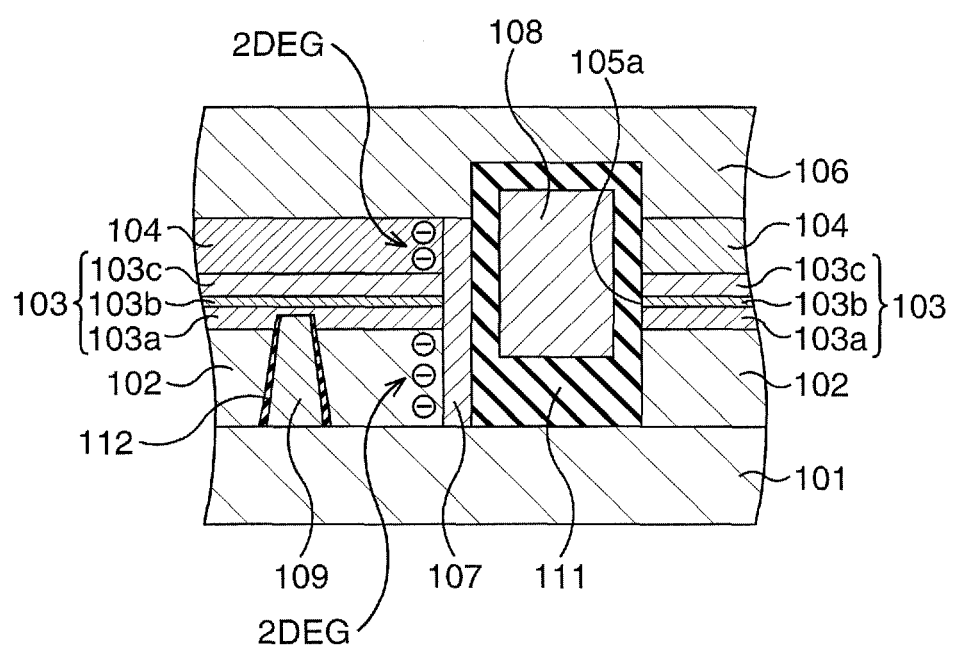
FIG. 1C is a sectional view illustrating a structure of a modification example of the first embodiment.

As illustrated in FIG. 1C, the compound semiconductor layer 103 may include, for example, three compound semiconductor layers 103a, 103b and 103c. In this example, the compound semiconductor layers 103a and 103c may be AlGaN layers, and the compound semiconductor layer 103b may be an AlN layer. For example, GaN, of which lattice constant is larger, and conduction band energy is lower than AlGaN and AlN, may be used for the materials of the compound semiconductor layers 102 and 104. An AlGaN layer is used for the compound semiconductor layer 107. The difference of the lattice constants between AlN for the compound semiconductor layer 103b and AlGaN for the compound semiconductor layers 102 and 104 is large, and therefore, the compound semiconductor layers 103a and 103c may also function as buffer layers. Note that, for example, thicknesses of the compound semiconductor layers 103a, 103b and 103c may be respectively approximately 100 mm, approximately 10 nm, and approximately 100 nm.

Also in this example, the similar effect as the case of the "combination of GaN and AlGaN" can be obtained. Moreover, the lattice constant of the compound semiconductor layer 103 is substantially smaller than that of the compound semiconductor layer 107, regarding the compound semiconductor layer 103, which includes the AlN compound semiconductor layer 103b, and the compound semiconductor layer 107 of AlGaN. Accordingly, it is possible to further surely suppress the generation of the 2DEG than the case of the "combination of GaN and AlGaN". Further, the compound semiconductor layer 103b of AlN is included in the compound semiconductor layer 103, and therefore, a leak current is drastically reduced.

(Second Embodiment)

Figure 2A:
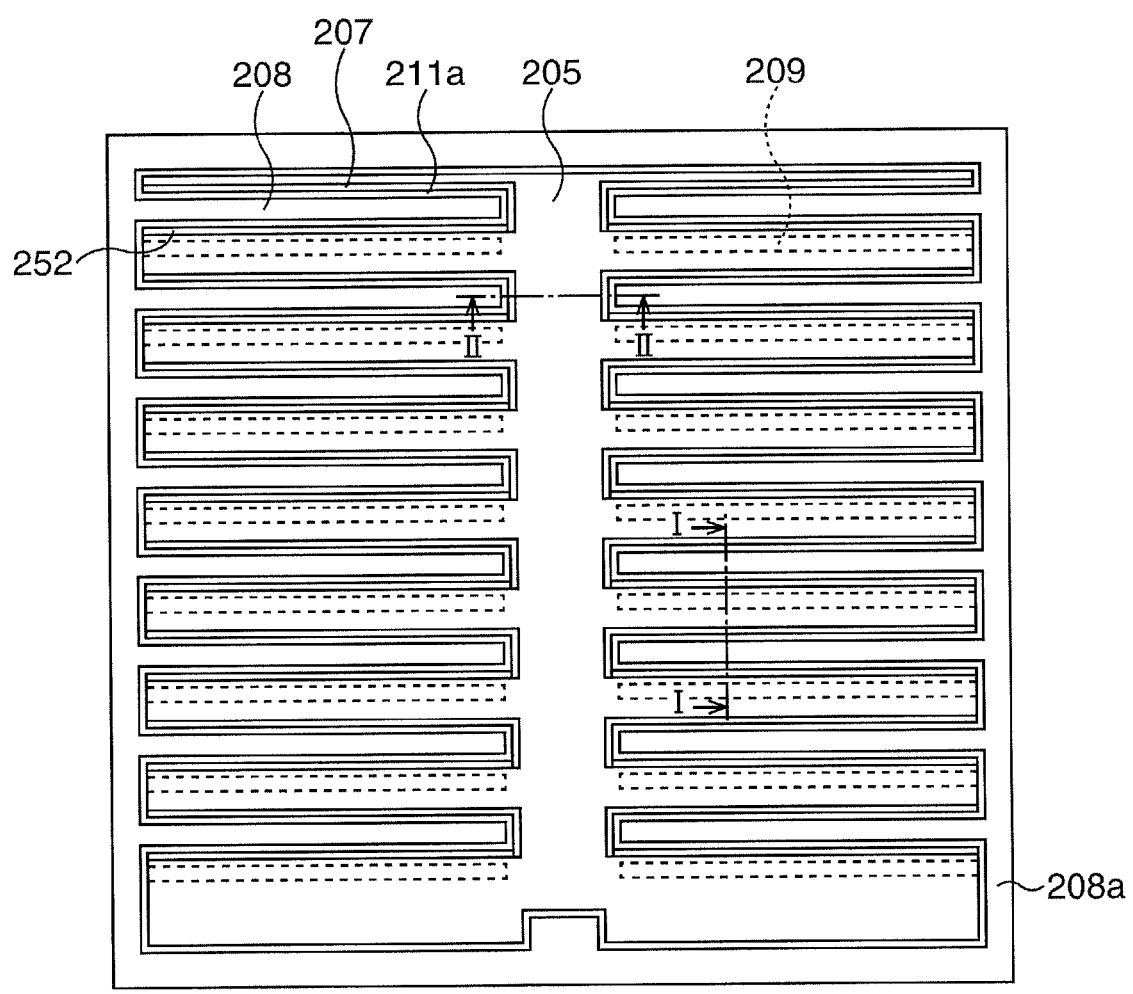
FIG. 2A is a view illustrating a positional relationship between electrodes of a compound semiconductor device according to a second embodiment.
Figure 2B:
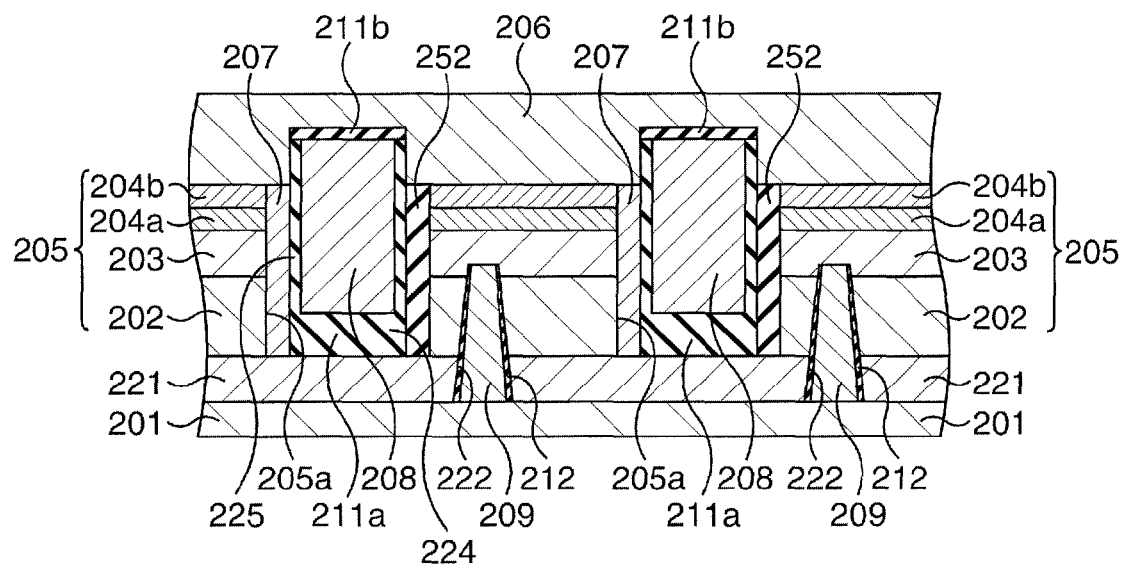
FIG. 2B is a view illustrating a cross section along a I-I line in FIG. 2A.
Figure 2C:
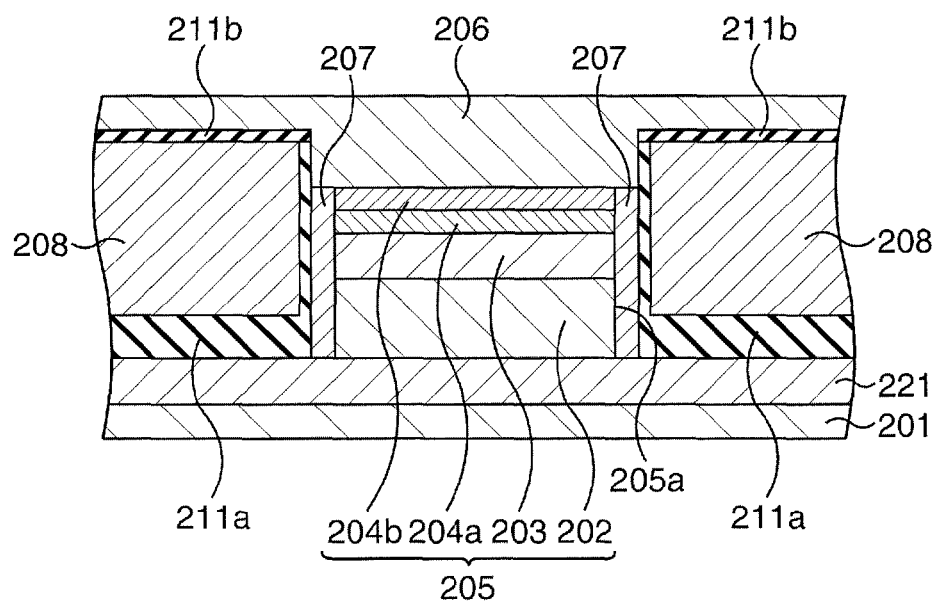
FIG. 2C is a view illustrating a cross section along a II-II line in FIG. 2A.

Next, a second embodiment is described. FIG. 2A is a view illustrating a positional relationship between electrodes of a compound semiconductor device according to the second embodiment, FIG. 2B is a view illustrating a cross section along a I-I line in FIG. 2A, and FIG. 2C is a view illustrating a cross section along a II-II line in FIG. 2A.

In the second embodiment, a GaN layer 202, an AlGaN layer 203, a GaN layer 204a and an n$^+$GaN layer 204b are formed over a conductive substrate 221 in this sequence.

For example, a conductive GaN single crystal substrate, a conductive sapphire substrate, a conductive SiC substrate, a conductive Si substrate, and so on may be used as the substrate 221. Note that a resistance of the substrate 221 is preferable to be low so as to suppress a resistance in a thickness direction of the substrate 221. A GaN single crystal substrate which contains Si as an n-type impurity may be cited as the conductive GaN single crystal substrate.

Si is doped into the GaN layer 202 for approximately $1 \times 10^{13}$ cm$^{-3}$ to $1 \times 10^{20}$ cm$^{-3}$, and a thickness thereof is approximately 100 nm to 10 μm. An n-type impurity is also doped into the AlGaN layer 203, and a thickness thereof is approximately 1 nm to 10 μm. A composition fraction of Al in the AlGaN layer 203 is 0.3. Note that when the thickness of the AlGaN layer 203 is less than 1 nm, there is a case when the normally-off operation is difficult. On the other hand, when the thickness of the AlGaN layer 203 exceeds 10 μm, there is a case when it is difficult to obtain an enough high electron concentration at ON-state. Accordingly, the thickness of the AlGaN layer 203 is preferable to be approximately 1 nm to 10 μm.

Si is doped into the GaN layer 204a for approximately $1 \times 10^{13}$ cm$^{-3}$ to $1 \times 10^{20}$ cm$^{-3}$, and a thickness thereof is approximately 1 nm to 10 μm. Si is doped into the n$^+$GaN layer 204b for approximately $1 \times 10^{16}$ cm$^{-3}$ to $1 \times 10^{22}$ cm$^{-3}$, and a thickness thereof is approximately 1 nm to 10 μm. A concentration of the n-type impurity in the n$^+$GaN layer 204b is higher than the concentration of the n-type impurity in the GaN layer 204a. Accordingly, a resistance of the n$^+$GaN layer 204b is lower than a resistance of the GaN layer 204a. Note that when a total thickness of the GaN layer 204a and the n$^+$GaN layer 204b is less than 5 nm, there is a case when an enough breakdown voltage may not be obtained. On the other hand, when the total thickness of the GaN layer 204a and the n$^+$GaN layer 204b exceeds 10 μm, a current density at ON-state is lowered in accordance with an increase of an ON-resistance. Accordingly, the total thickness of the GaN layer 204a and the n$^+$GaN layer 204b is preferable to be approximately 5 nm to 10 μm.

A stack 205 includes the GaN layer 202, the AlGaN layer 203, the GaN layer 204a and the n$^+$GaN layer 204b, and an opening 205a is formed in the stack 205. A gate electrode 208 of which lower surface and side surface are covered with an insulating film 211a is formed in the opening 205a. A stack of a Ni film and a Au film thereon is formed as the gate electrode 208. The gate electrodes 208 are formed in plural in a comb-teeth state (finger state), as illustrated in FIG. 2A, and one end of each gate electrode 208 is connected to a gate bus line 208a. The insulating film 211a is not in contact with side surfaces of the GaN layer 202, the AlGaN layer 203, the GaN layer 204a and the n$^+$GaN layer 204b. An AlGaN layer 207 is formed between the insulating film 211a and the GaN layer 202, the AlGaN layer 203, the GaN layer 204a and the n$^+$GaN layer 204b at one side in a direction perpendicular to a direction to which the gate electrode 208 extends (a gate width direction) in a plan view. The AlGaN layer 207 is in contact with the side surfaces of the GaN layer 202, the AlGaN layer 203, the GaN layer 204a and the n$^+$GaN layer 204b. As stated above, the gate electrodes 208 are insulated from the substrate 221, the AlGaN layer 207, and so on. Besides, at the other side, a silicon oxide film 252 is formed between the insulating film 211a and the GaN layer 202, the AlGaN layer 203, the GaN layer 204a and the n$^+$GaN layer 204b. Note that an n-type impurity is also doped into the AlGaN layer 207, and a thickness thereof is approximately 1 nm to 1 μm. The composition fraction of Al in the AlGaN layer 207 is 0.3. When the thickness of the AlGaN layer 207 is less than 1 nm, there is a case when it is difficult to generate the 2DEG with enough concentration. On the other hand, when the thickness of the AlGaN layer 207 exceeds 1 μm, there is a case when it is difficult to apply an electric field to an interface between the AlGaN layers 203 and 207 from the gate electrodes 208. Accordingly, the thickness of the AlGaN layer 207 is preferable to be approximately 1 nm to 1 μm.

Further, an insulating film 211b covering the gate electrodes 208 and the insulating film 211a is formed. A source electrode 206 is formed over the n$^+$GaN layer 204b, the insulating film 211b, and so on. The source electrode 206 is insulated from the gate electrodes 208 by the insulating film 211b. A stack of a Ta film and an Al film thereon is formed as the source electrode 206.

Besides, in the present embodiment, openings 222 are formed in the substrate 221 and the GaN layer 202 each in a vicinity of the silicon oxide film 252, and an electrode 209 insulated from the GaN layer 202 by the insulating film 212 is formed in each of the openings 222. Further, a drain electrode 201 in contact with the substrate 221 and the electrodes 209 is formed at a rear surface of the substrate 221. Note that the drain electrode 201 and the electrodes 209 may be integrally formed. In this case, these include a stack of, for example, a Ta film and an Al film thereon. The conductive substrate 221 and the drain electrode 201 may be regarded as one electrode.

Note that a portion 225 of the insulating film 211a between the gate electrode 208 and the AlGaN layer 207 functions as a gate insulating film of the HEMT. Accordingly, a thickness of the portion 225 is preferable to be approximately 1 nm to 100 nm. Besides, a thickness of a portion 224 of the insulating film 211a between the gate electrode 208 and the substrate 221 is preferable to be equal to or more than the thickness of the portion 225. When the thickness of the portion 224 is less than the thickness of the portion 225, the distance between the gate electrode 208, and the substrate 221 and the drain electrode 201 is short, and an enough breakdown voltage is difficult to obtain. On the other hand, the thickness of the portion 224 is preferable to be equal to or less than the thickness of the GaN layer 202. When the thickness of the portion 224 exceeds the thickness of the GaN layer 202, a bottom surface of the gate electrode 208 positions at upward of a bottom surface of the AlGaN layer 203, and it is difficult to control an electric potential at an interface between the AlGaN layer 203 and the AlGaN layer 207 with the gate electrode 208.

In the second embodiment constituted as stated above, a distortion resulting from a difference between lattice constants of the GaN layer 202 and the AlGaN layer 207 is generated in the AlGaN layer 207. Similarly, a distortion resulting from a difference between lattice constants of the GaN layer 204a and the n$^+$GaN layer 204b, and the AlGaN layer 207 is generated in the AlGaN layer 207. A piezoelectric polarization and a spontaneous polarization are generated caused by these distortions, and two-dimensional electron gas (2DEG) is generated in a vicinity of interfaces of the GaN layer 202, the GaN layer 204a and the n$^+$GaN layer 204b with the AlGaN layer 207. Accordingly, a current flowing between the source electrode 206 and the drain electrode 201 changes in accordance with an electric potential at the interface between the AlGaN layer 203 and the AlGaN layer 207. Moreover, it is possible to control the electric potential of the interface with the gate electrode 208.

In the second embodiment, when a negative voltage is applied to the drain electrode 201, electrons move from the drain electrode 201 to the source electrode 206 through the AlGaN layer 203, the GaN layer 204a and the n⁺GaN layer 204b, and a current flows from the source electrode 206 to the drain electrode 201. Namely, a function of a free wheel diode can be obtained. Moreover, the electrode 209 is in contact with the drain electrode 201 and the AlGaN layer 203, and the source electrode 206 is in contact with the n⁺GaN layer 204b, and therefore, the free wheel diode operates before a large current flows in the HEMT. Accordingly, an increase of power consumption can be suppressed. When a positive large voltage is applied to the drain electrode 201, the electrons move from the source electrode 206 to the drain electrode 201 through the n⁺GaN layer 204b, the GaN layer 204a and the AlGaN layer 203, and a current flows from the drain electrode 201 to the source electrode 206. Namely, a function of a protective diode can be obtained. Accordingly, a trouble of the HEMT can be prevented.

Here, simulations relating to the second embodiment performed by the present inventor are described.

(First Simulation)

Figure 3A:
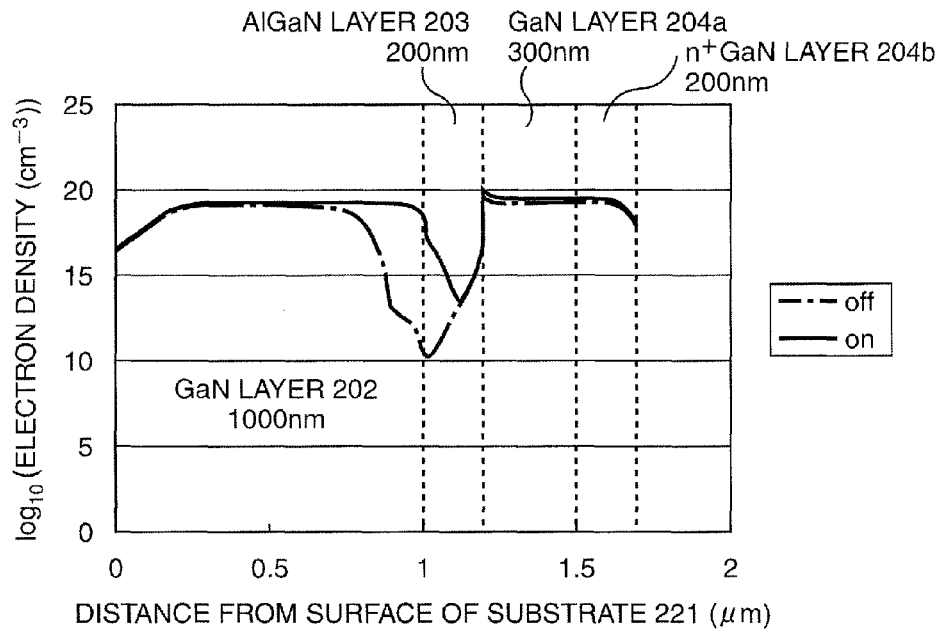
FIG. 3A is a view illustrating a relationship of an electron density with a distance from a front surface of a substrate.
Figure 3B:
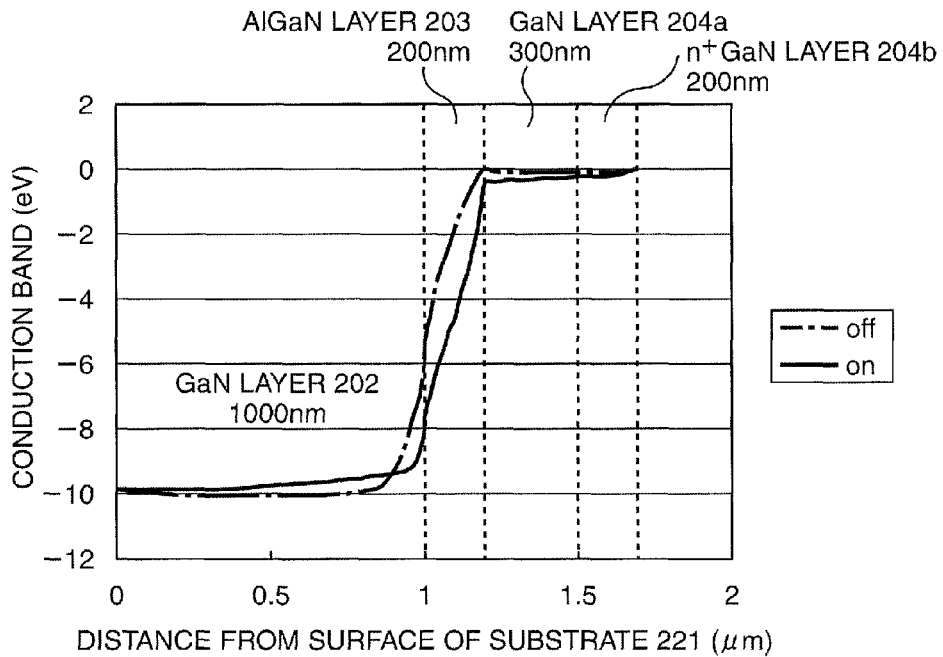
FIG. 3B is a view illustrating a relationship of a conduction band energy with the distance from the front surface of the substrate.

In a first simulation, a relationship between an electron density (cm⁻³) and a distance from a front surface of the substrate 221, and a relationship between a conduction band energy (eV) and a distance from the front surface of the substrate 221 were examined. In this simulation, the thickness of the GaN layer 202 was set to be 1000 nm, the thickness of the AlGaN layer 203 was set to be 200 nm, the thickness of the GaN layer 204a was set to be 300 nm, and the thickness of the n⁺GaN layer 204b was set to be 200 nm. Results thereof are illustrated in FIG. 3A and FIG. 3B. Note that a relationship when a gate voltage Vgs is "0" (zero) V, and the power is turned off is represented by a dashed line, and a relationship when the gate voltage Vgs is 10 V, and the power is turned on is represented by a solid line in FIG. 3A. The gate voltage Vgs is equal to a source-drain voltage Vds.

As represented in FIG. 3A, the electron density discontinuously decreased at an AlGaN/GaN hetero-junction surface at the AlGaN layer 203 when the power was turned off. Accordingly, the current does not flow between the source electrode 206 and the drain electrode 201. On the other hand, when the power was turned on, the electrons were drawn toward an electric field applied by the gate electrode 208, and therefore, the electron density of the AlGaN layer 203 was extremely high compared to the time when the power is turned off. Accordingly, the current certainly flows between the source electrode 206 and the drain electrode 201. Therefore, it turns out that the turning on and off of the HEMT is certainly switched by switching the voltage applied to the gate electrode 208.

Moreover, as represented in FIG. 3B, the conduction band energy of the AlGaN layer 203 was high when the power was turned off compared to the case when the power was turned on. It means that the number of electrons existing at the AlGaN layer 203 is extremely small when the power is turned off compared to the case when the power is turned on. Accordingly, it turns out that the HEMT performs the normally-off operation.

(Second Simulation)

In a second simulation, diode characteristics were investigated. A result thereof is represented in FIG. 3C.

Figure 3C:
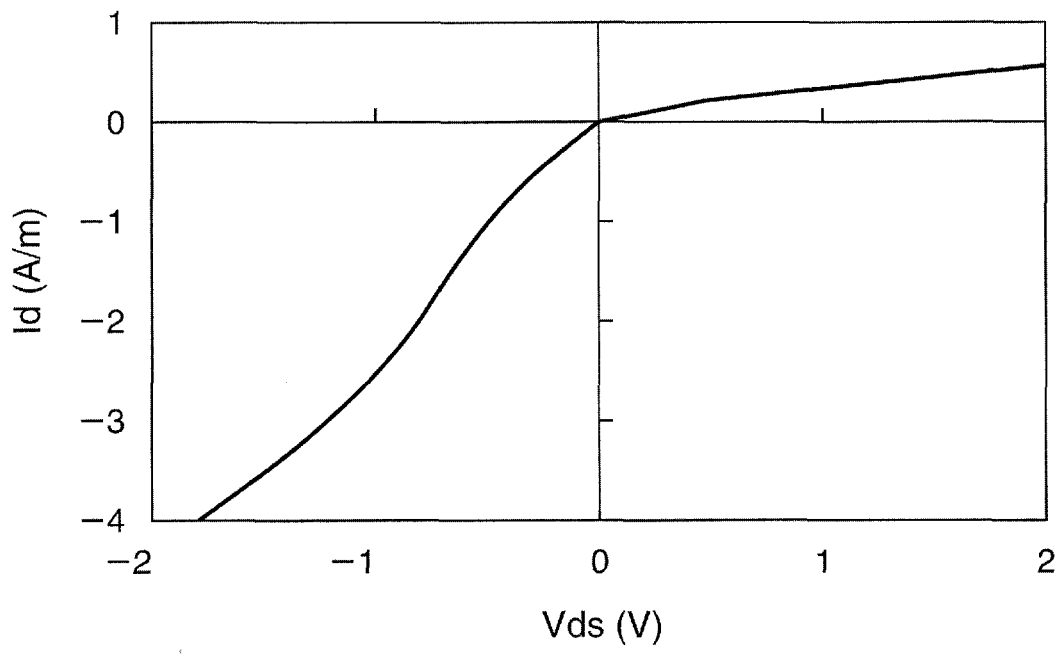
FIG. 3C is a view illustrating diode characteristics.

As represented in FIG. 3C, proper diode characteristics were verified. Accordingly, it turns out that the functions of a free wheel diode and a protective diode can be obtained.

(Third Simulation)

In a third simulation, a relationship of a drain current Id (A/m) with the gate voltage Vgs (V) was investigated. In this simulation, the source-drain voltage Vds was set to be 10 V. A result thereof is represented in FIG. 3D.

Figure 3D:
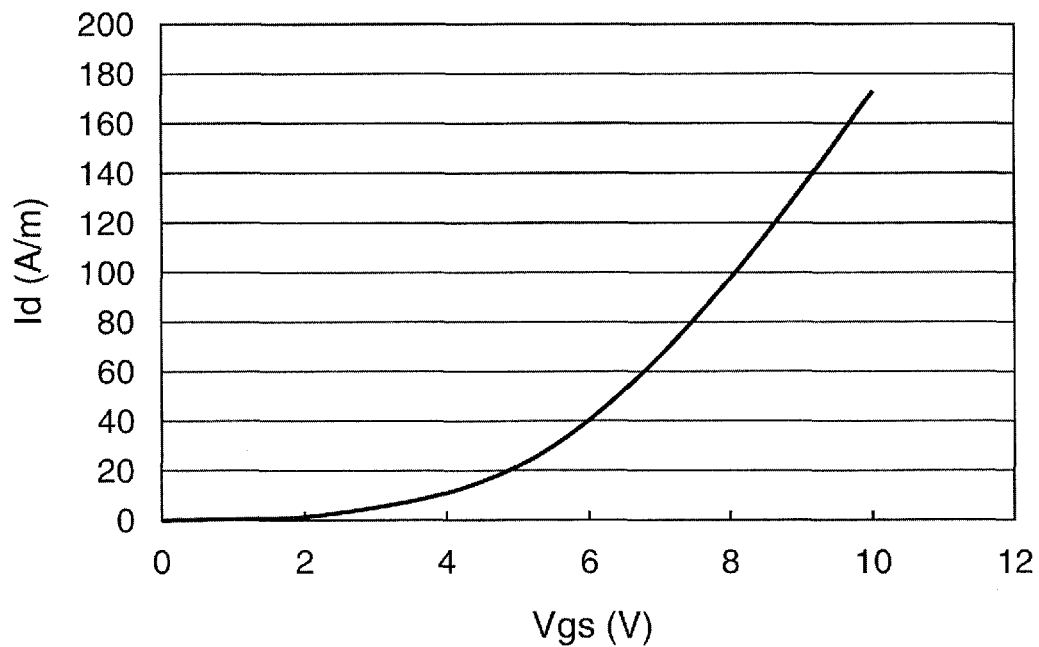
FIG. 3D is a view illustrating a relationship of a drain current with a gate voltage.

As represented in FIG. 3D, the drain current Id was "0" (zero) A/m when the gate voltage Vgs was "0" (zero) V. This means that the fine normally-off operation is enabled. Moreover, it was verified that the drain current Id properly increased in accordance with an increase of the gate voltage Vgs. Accordingly, it turns out that the HEMT performs the normally-off operation, and the characteristics of the HEMT are good.

(Fourth Simulation)

In a fourth simulation, a relationship of the drain current Id (A/m) with the source-drain voltage Vds (V) was investigated. In this simulation, the gate voltage Vgs was set to be "0" (zero) V, 2 V, 4 V, 6 V, 8 V, or 10 V. Results thereof are represented in FIG. 3E.

Figure 3E:
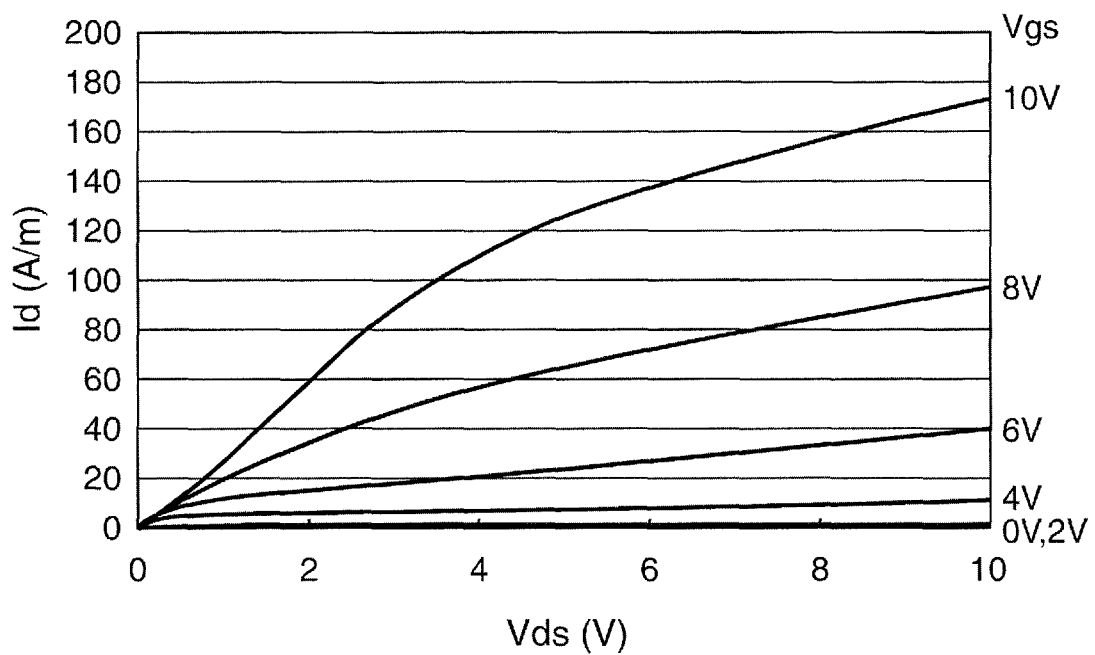
FIG. 3E is a view illustrating a relationship of a drain current Id with a voltage between source-drain.

As represented in FIG. 3E, the drain current Id was "0" (zero) A/m when the gate voltage Vgs was "0" (zero) V regardless of the source-drain voltage Vds. This means that the fine normally-off operation is enabled. Moreover, it was verified that the drain current Id properly increased in accordance with the increase of the source-drain voltage Vds. Accordingly, it turns out that the HEMT performs the normally-off operation, and the characteristics of the HEMT are fine.

Next, a method of manufacturing the compound semiconductor device according to the second embodiment is described. FIG. 4A to FIG. 4D are views illustrating the method of manufacturing the compound semiconductor device according to the second embodiment in process sequence, and mainly represent a positional relationship between electrodes as same as FIG. 2A. FIG. 5A to FIG. 5L are sectional views illustrating the method of manufacturing the compound semiconductor device according to the second embodiment in process sequence.

Figure 4A:
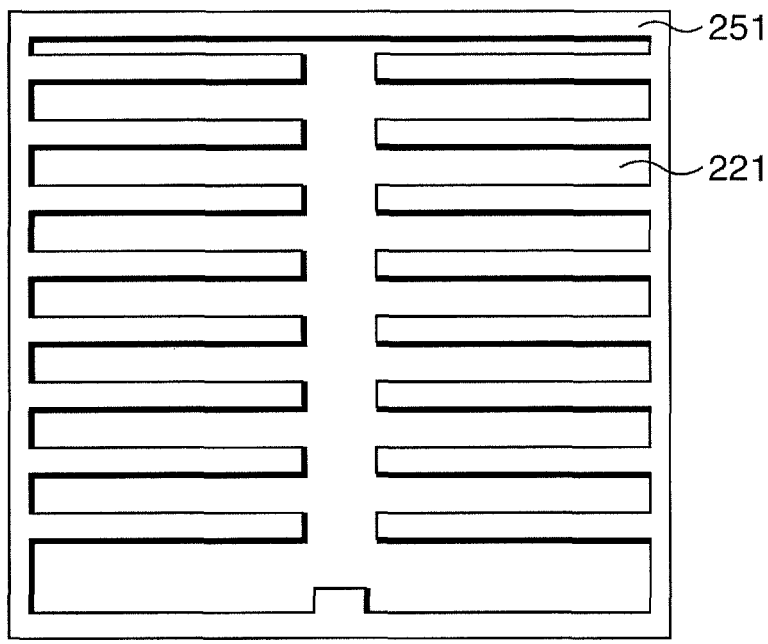
FIG. 4A is a view illustrating a method of manufacturing a compound semiconductor device according to a second embodiment.
Figure 5A:
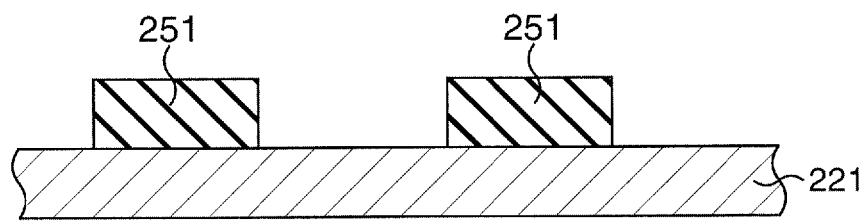
FIG. 5A is a sectional view illustrating the method of manufacturing a compound semiconductor device according to the second embodiment.

First, as illustrated in FIG. 4A and FIG. 5A, a mask 251 for selective growth is formed on the substrate 221. For example, a silicon oxide film may be formed over the whole surface of the substrate 221 by a chemical vapor deposition (CVD) method or the like, and thereafter, the silicon oxide film may be removed from an area where the stack 205 is to be formed by lithography and dry-etching, in order to form the mask 251. A planar shape of the mask 251 roughly is made the comb-teeth state (finger state) similar to the planar shape of the gate electrodes 208.

Figure 4B:
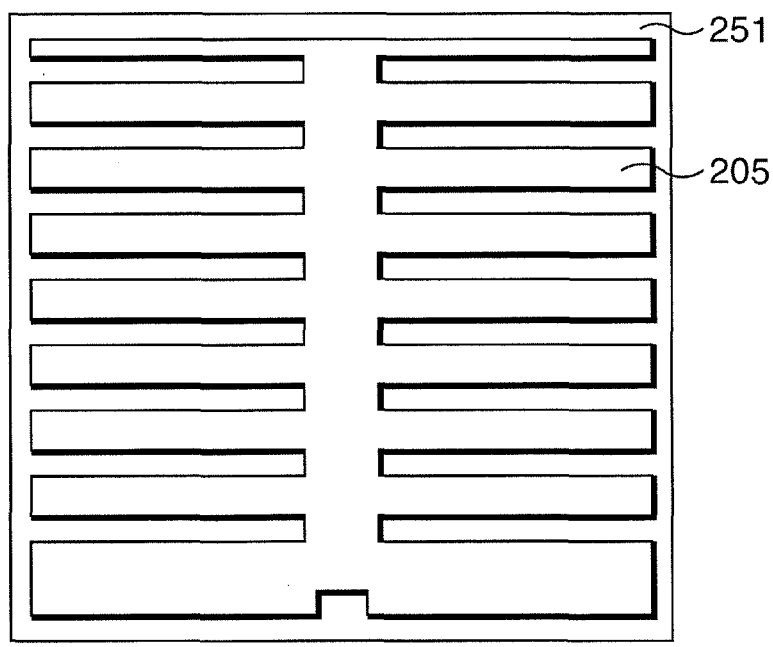
FIG. 4B is a view illustrating the method of manufacturing a compound semiconductor device subsequent to FIG. 4A.
Figure 5B:
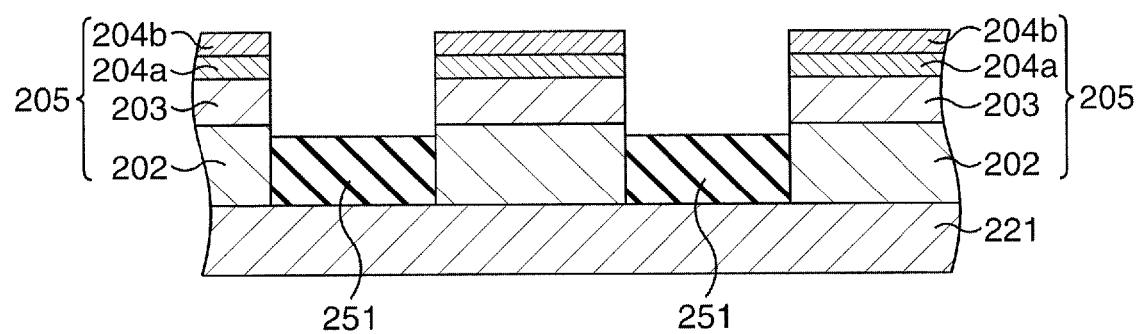
FIG. 5B is a sectional view illustrating the method of manufacturing a compound semiconductor device subsequent to FIG. 5A.

Then, as illustrated in FIG. 4B and FIG. 5B, the GaN layer 202, the AlGaN layer 203, the GaN layer 204a and the n⁺GaN layer 204b are formed over the substrate 221 in this sequence by, for example, a metal organic chemical vapor deposition (MOCVD) method. The GaN layer 202, the AlGaN layer 203, the GaN layer 204a and the n⁺GaN layer 204b may be formed by a molecular beam epitaxy (MBE) method.

Figure 6:
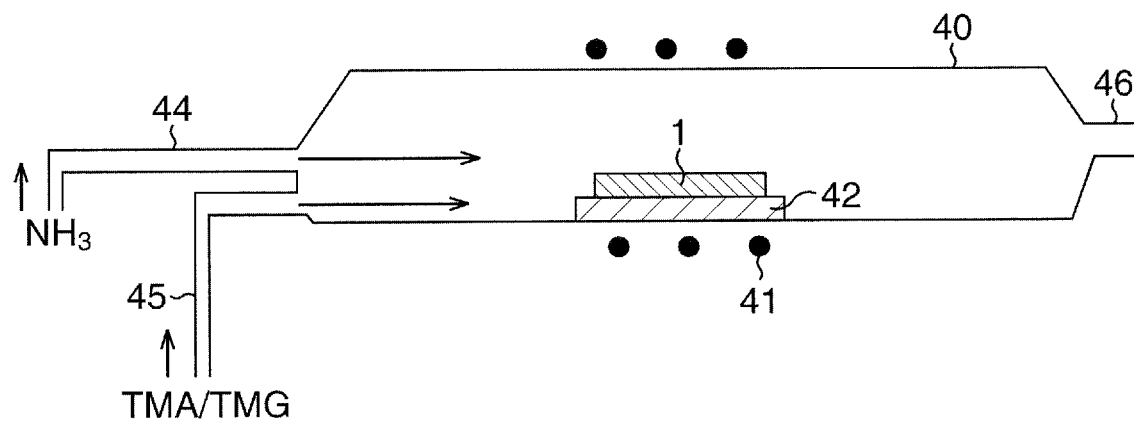
FIG. 6 is a view illustrating a configuration of an MOCVD device.

Here, an MOCVD apparatus will be described. FIG. 6 is a diagram illustrating a structure of an MOCVD apparatus. A high-frequency coil 41 is disposed around a reaction tube 40 made of quartz, and a carbon susceptor 42 that mounts a substrate 1 is disposed inside the reaction tube 40. Two gas introduction tubes 44 and 45 are connected on an upstream end (end portion on the left side in FIG. 6) of the reaction tube 40, through which a source gas of chemical compound is supplied. For example, an NH₃ gas is introduced as an N source gas from the gas introduction tube 44, and an organic group III chemical compound raw material such as a trimethyl aluminum (TMA), trimethyl gallium (TMG), or the like is introduced as a source gas of group III element from the gas introduction tube 45. Crystal growth is performed on the substrate 1, and excess gasses are exhausted to a detoxifying tower from a gas exhaust tube 46. Note that when the crystal growth by the MOCVD method is performed in a reduced pressure atmosphere, the gas exhaust tube 46 is connected to a vacuum pump, and an exhaust port of the vacuum pump is connected to the detoxifying tower.

In the MOCVD method, the GaN layer 202, the AlGaN layer 203, the GaN layer 204a and the n+GaN layer 204b selectively grow at portions exposing from the mask 251 of the substrate 221. When these layers are formed, presence/absence of supply and a flow rate of each of TMA gas being an Al source and TMG gas being a Ga source are appropriately set in accordance with the compound semiconductor layer to be formed. A flow rate of ammonia gas being an N-source is set to be approximately 10 slm to 50 slm. A growth pressure is set to be approximately 50 Torr to 300 Torr, and a growth temperature is set to be approximately 800° C. to 1300° C. Further, when the n-type impurity is contained, for example, gas containing Si, for example, $SiH_4$ gas is added to source gas at a predetermined flow rate, and Si is doped to be a predetermined value within the above-stated each concentration range.

Conditions for forming AlGaN layer 203 are set for example as:
flow rate of trimethyl gallium (TMG): 0 to 50 sccm,
flow rate of trimethyl aluminum (TMA): 0 to 50 sccm,
flow rate of ammonium ($NH_3$): 20 slm,
pressure: 100 Torr, and
temperature: 1100° C.

Figure 5C:
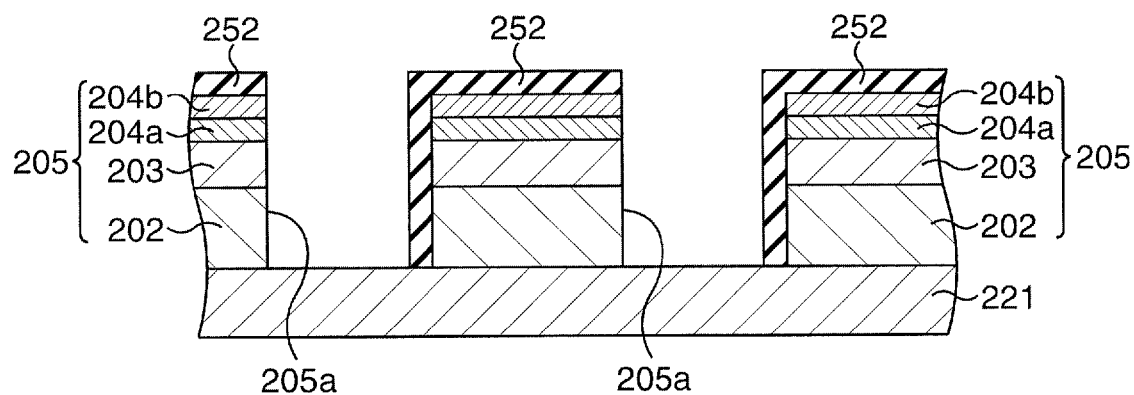
FIG. 5C is a sectional view illustrating the method of manufacturing a compound semiconductor device subsequent to FIG. 5B.

After the n+GaN layer 204b is formed, the mask 251 is removed by wet-etching or the like, as illustrated in FIG. 5C. The stack 205 including the opening 205a is obtained after the removal of the mask 251. Note that when the substrate 221 is an n-type single crystal substrate, of which surface is a non-polarity surface, each of the surfaces of the GaN layer 202, the AlGaN layer 203, the GaN layer 204a and the n+GaN layer 204b is perpendicular to an a-axis direction. Namely, the surface is perpendicular to the a-axis direction in each of the compound semiconductor layers. Besides, a plane orientation of each of side surfaces of the GaN layer 202, the AlGaN layer 203, the GaN layer 204a and the n+GaN layer 204b facing the opening 205a is (0001). Namely, the Miller index of the side surface is (0001) in each of the compound semiconductor layers.

Note that the stack 205 may be formed by processing each of the compound semiconductor layers by lithography and the dry-etching after the respective compound semiconductor layers are formed at the whole surface of the substrate 221 instead of using the selective growth method as stated above.

After the removal of the mask 251, the silicon oxide film 252 as a mask for selective growth covering a part of the stack 205 is formed, similarly as illustrated in FIG. 5C. The silicon oxide film 252 is formed to expose an area where the AlGaN layer 207 is to be grown and to cover the other parts of the stack 205. For example, a silicon oxide film may be formed over the whole surface of the substrate 221 by a CVD method or the like, and thereafter, the silicon oxide film may be removed from an area where the AlGaN layer 207 is to be formed by lithography and dry-etching, in order to form the silicon oxide film 252.

Figure 5D:
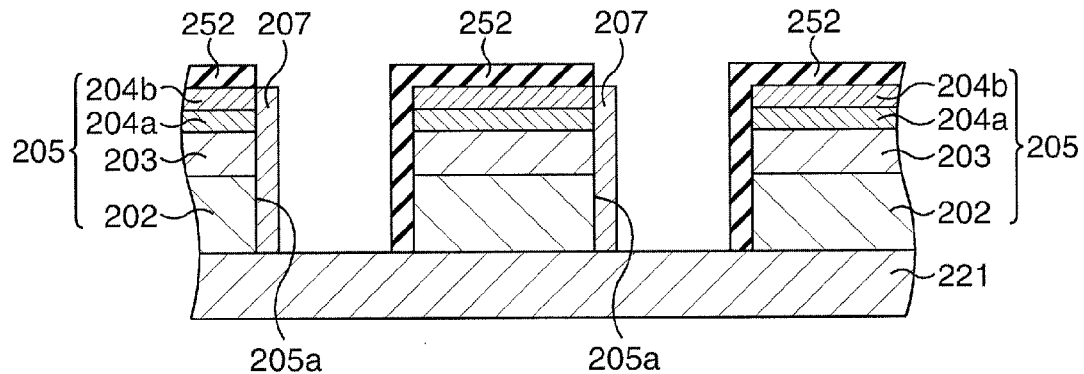
FIG. 5D is a sectional view illustrating the method of manufacturing a compound semiconductor device subsequent to FIG. 5C.

Then, the AlGaN layer 207 is formed on the portion exposing from the silicon oxide film 252 of the stack 205 by, for example, an MOCVD method, as illustrated in FIG. 5D. For example, the MOCVD apparatus illustrated in FIG. 6 may be used also at this time. In the MOCVD method, the AlGaN layer 207 selectively grows in a lateral direction at the portion exposing from the silicon oxide film 252 of the stack 205. As a result, a part of the side surface of the stack 205 is covered with the AlGaN layer 207 from a lowermost part to an uppermost part. For example, the similar growth condition as that of the AlGaN layer 203 may be used as a growth condition of the AlGaN layer 207.

Figure 5E:
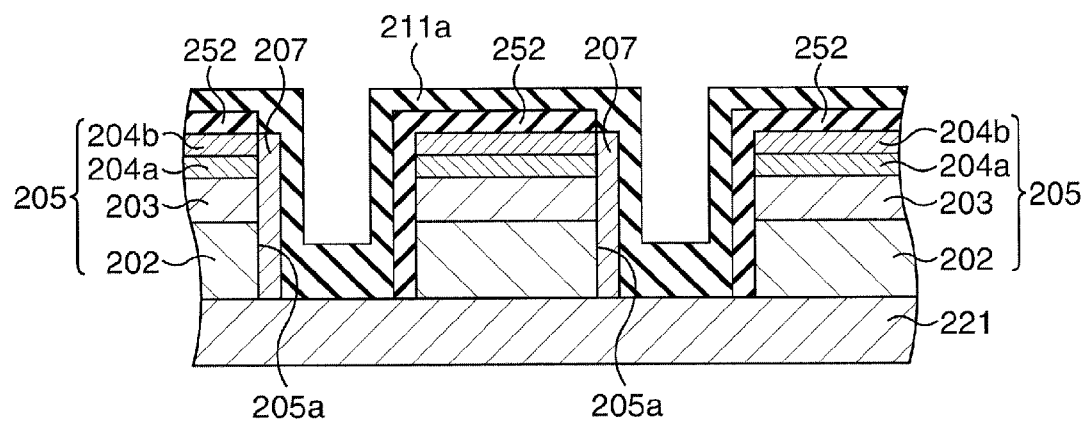
FIG. 5E is a sectional view illustrating the method of manufacturing a compound semiconductor device subsequent to FIG. 5D.

After the AlGaN layer 207 is formed, the insulating film 211a is formed over the whole surface, and a surface thereof is smoothed by, for example, a chemical mechanical polishing (CMP) method, as illustrated in FIG. 5E. A silicon nitride film of which thickness is approximately 50 nm is formed as the insulating film 211a by, for example, a plasma CVD method, an atomic layer deposition (ALD) method, or the like. Besides, a hafnium oxide film, a tantalum oxide film or an aluminum oxide film may be formed instead of the silicon nitride film. Further, two or more kinds from among these four kinds may be stacked to be used.

Figure 5F:
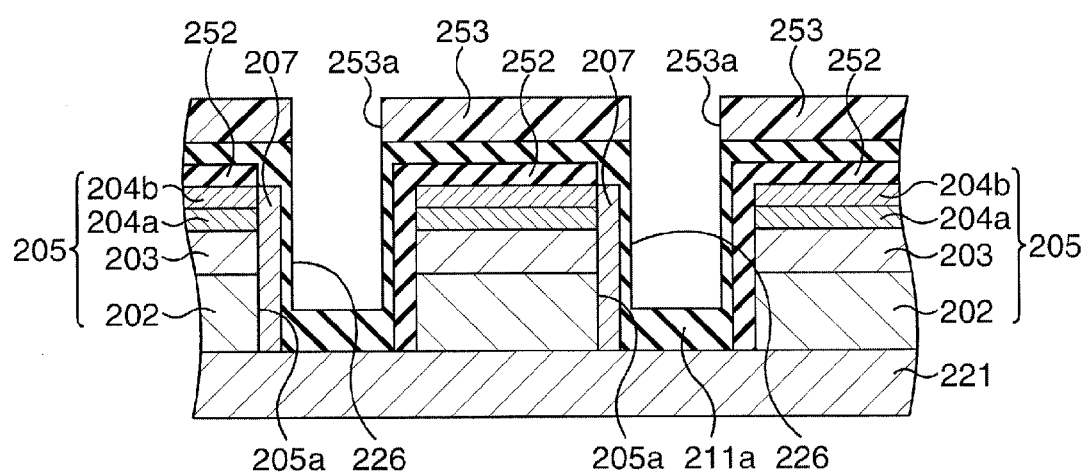
FIG. 5F is a sectional view illustrating the method of manufacturing a compound semiconductor device subsequent to FIG. 5E.

Then, a resist pattern 253 in which an opening 253a is formed at a portion where the gate electrode 208 is to be formed is formed on the insulating film 211a, as illustrated in FIG. 5F. Thereafter, the insulating film 211a is processed using the resist pattern 253 as a mask, and thereby, an electrode trench 226 is formed in the insulating film 211a. A dry-etching using, for example, $SF_6$ gas may be performed in order to form the electrode trench 226.

Figure 4C:
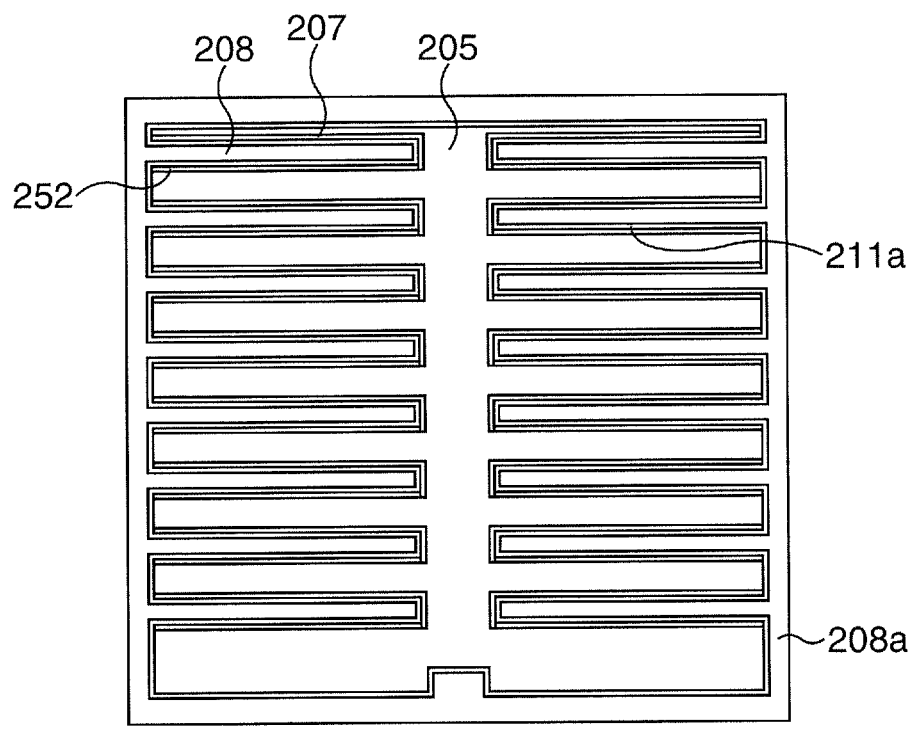
FIG. 4C is a view illustrating the method of manufacturing a compound semiconductor device subsequent to FIG. 4B.
Figure 5G:
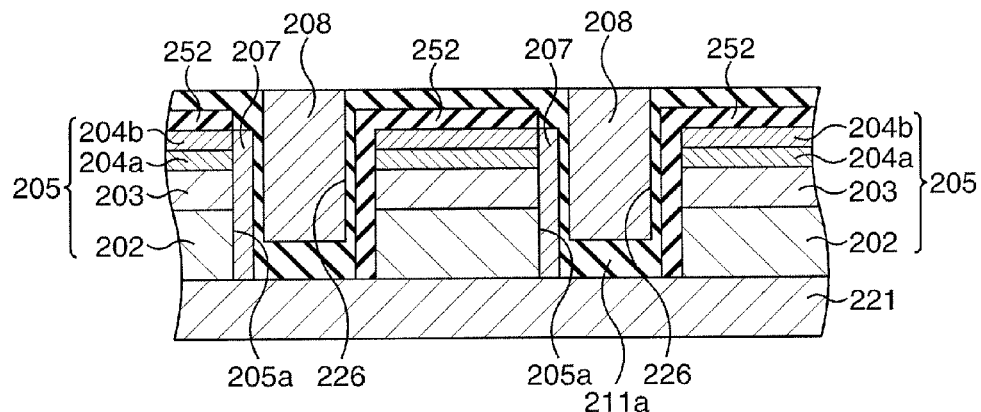
FIG. 5G is a sectional view illustrating the method of manufacturing a compound semiconductor device subsequent to FIG. 5F.

Subsequently, the gate electrode 208 is formed in the electrode trench 226, as illustrated in FIG. 4C and FIG. 5G. The gate electrode 208 may be formed by, for example, a lift-off method. The resist pattern 253 is also used when the gate electrode 208 is formed, and removed after the formation of the gate electrode 208.

Figure 5H:
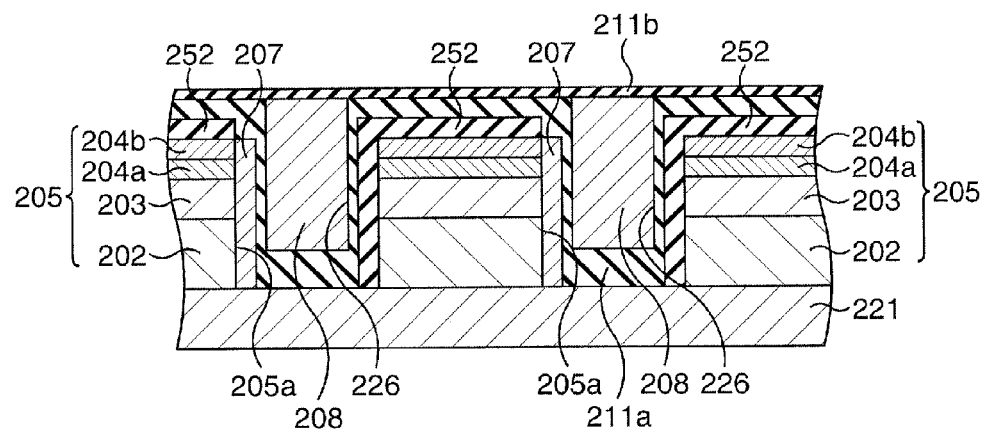
FIG. 5H is a sectional view illustrating the method of manufacturing a compound semiconductor device subsequent to FIG. 5G.

Then, the insulating film 211b covering the gate electrode 208 is formed over the insulating film 211a, as illustrated in FIG. 5H. A silicon nitride film of which thickness is approximately 1000 nm may be formed as the insulating film 211b by, for example, a plasma CVD method or the like.

Figure 5I:
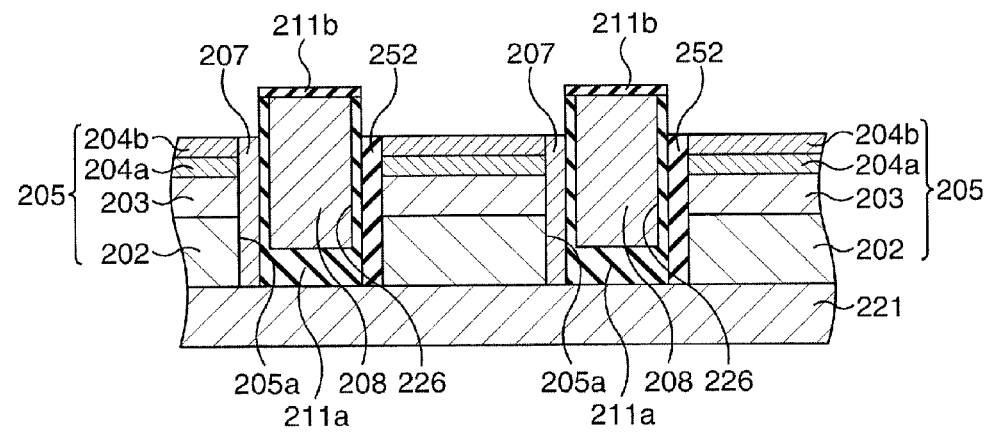
FIG. 5I is a sectional view illustrating the method of manufacturing a compound semiconductor device subsequent to FIG. 5H.

Thereafter, at least the n+GaN layer 204b and the AlGaN layer 207 are exposed by processing the insulating film 211b, the insulating film 211a and the silicon oxide film 252, as illustrated in FIG. 5I.

Figure 4D:
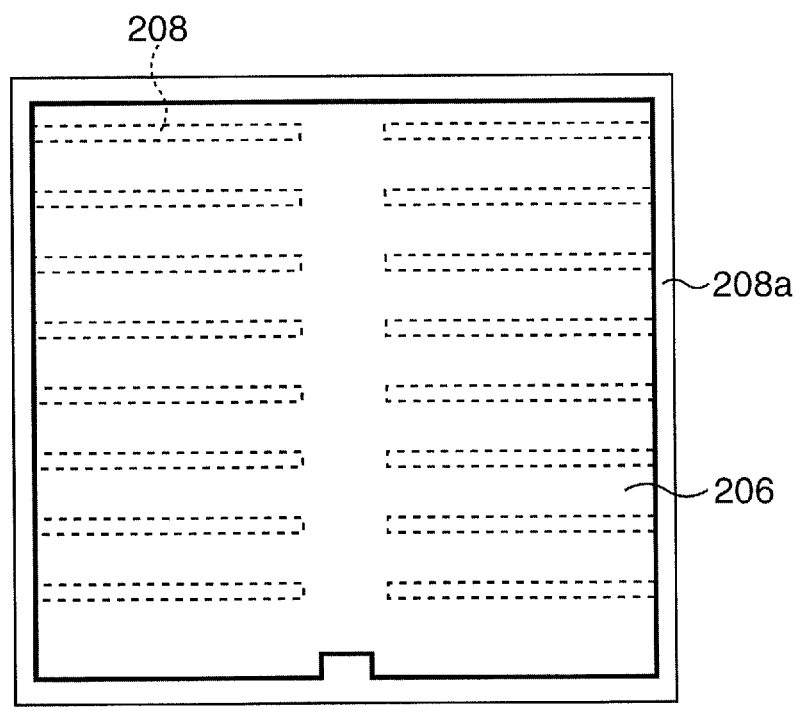
FIG. 4D is a view illustrating the method of manufacturing a compound semiconductor device subsequent to FIG. 4C.
Figure 5J:
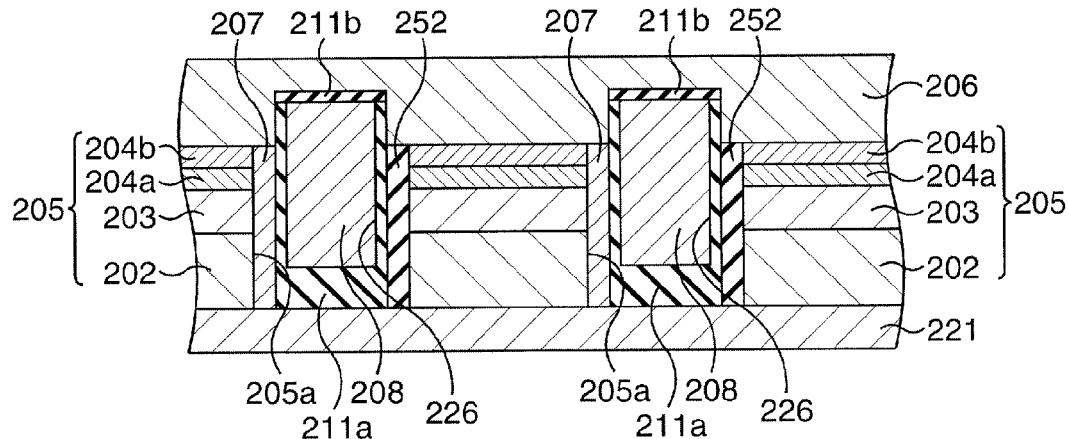
FIG. 5J is a sectional view illustrating the method of manufacturing a compound semiconductor device subsequent to FIG. 5I.

Subsequently, the source electrode 206, which is in contact with the n+GaN layer 204b and the AlGaN layer 207, is formed, as illustrated in FIG. 4D and FIG. 5J. The source electrode 206 may be formed by, for example, a lift-off method so as not to be in contact with the gate bus line 208a. Then, a front surface side of the substrate 221 is covered with a surface protection layer, and the thickness of the substrate 221 is adjusted by polishing a rear surface of the substrate 221.

Figure 5K:
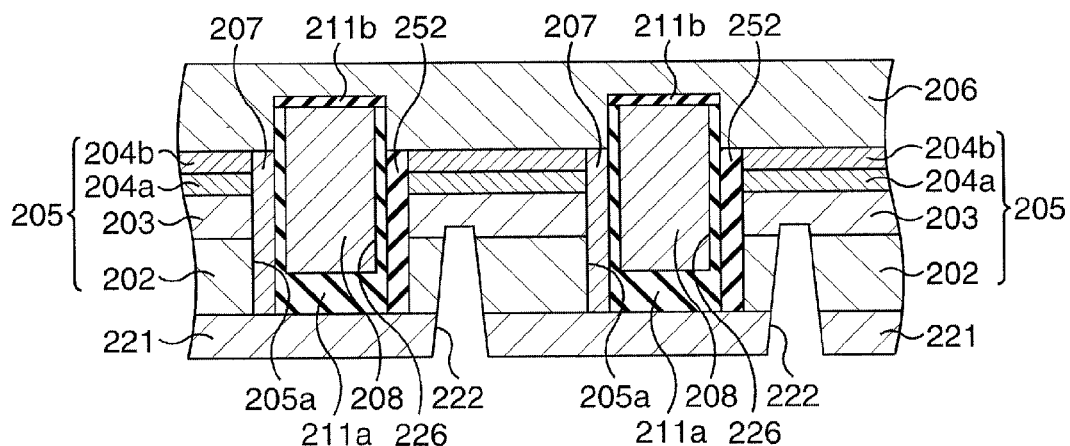
FIG. 5K is a sectional view illustrating the method of manufacturing a compound semiconductor device subsequent to FIG. 5J.

Then, the opening 222 reaching the AlGaN layer 203 is formed in the substrate 221 and the GaN layer 202, as illustrated in FIG. 5K.

Figure 5L:
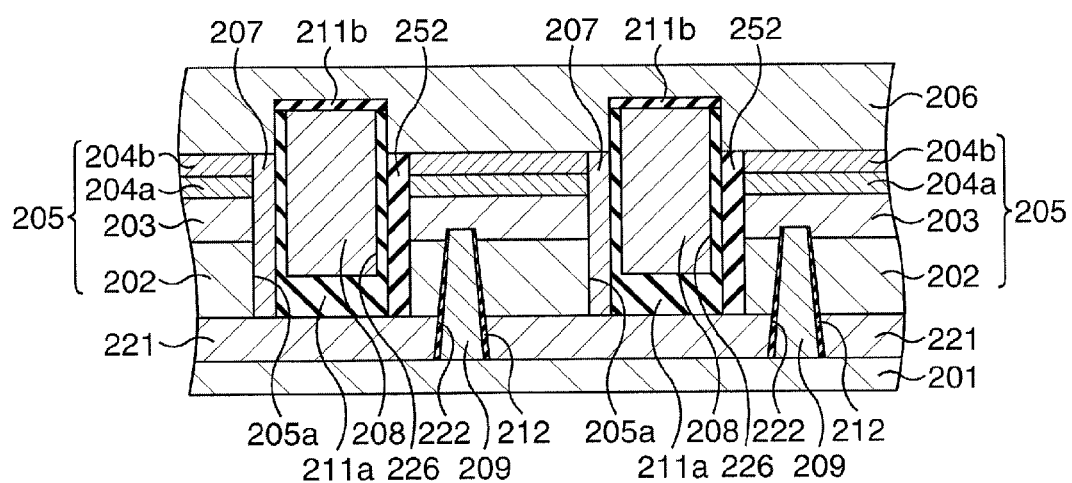
FIG. 5L is a sectional view illustrating the method of manufacturing a compound semiconductor device subsequent to FIG. 5K.

Thereafter, the insulating film 212 is formed at the side surface of the opening 222, as illustrated in FIG. 5L. For example, a silicon nitride film is formed as the insulating film 212. The electrode 209 is formed in the openings 222, further, the drain electrode 201 is formed on the rear surface of the substrate 221. The electrode 209 and the drain electrode 201 may be integrally formed, and in this case, the Ta film and the Al film may be sequentially formed by, for example, a vapor deposition method.

The compound semiconductor device according to the second embodiment may be completed as stated above.

Figure 7A:
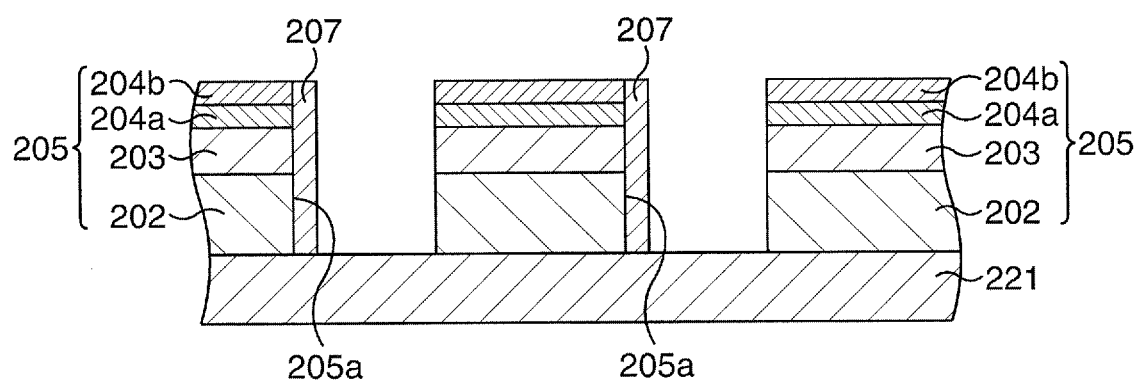
FIG. 7A is a sectional view illustrating a modification example of the method illustrated in FIG. 5A to FIG. 5L.
Figure 7B:
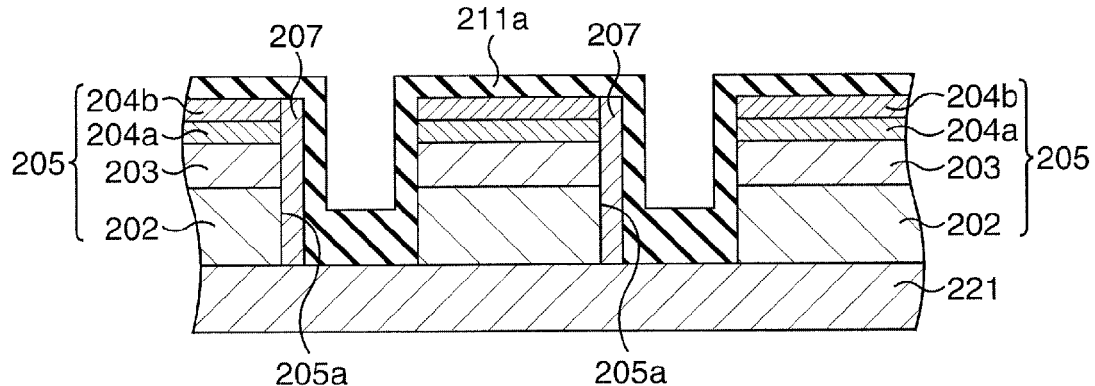
FIG. 7B is a sectional view illustrating the modification example subsequent to FIG. 7A.
Figure 7C:
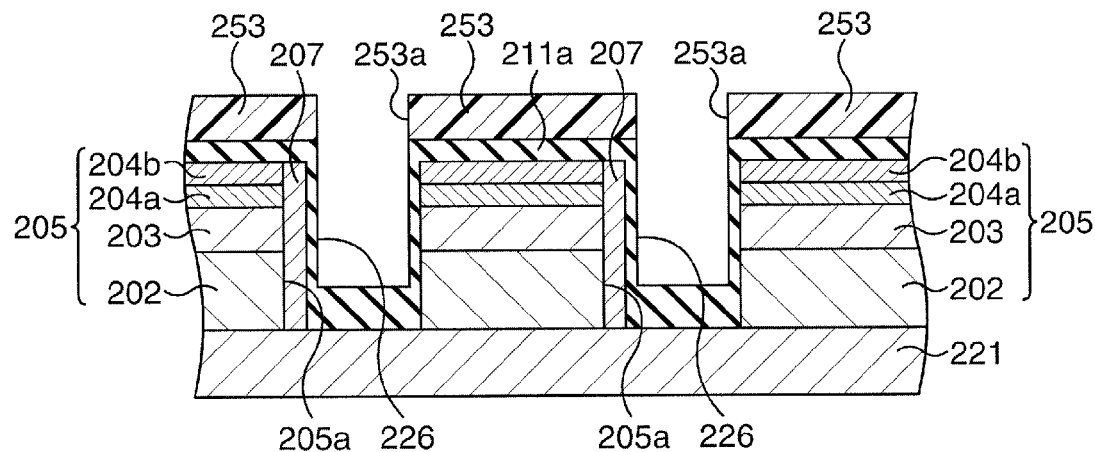
FIG. 7C is a sectional view illustrating the modification example subsequent to FIG. 7B.
Figure 7D:
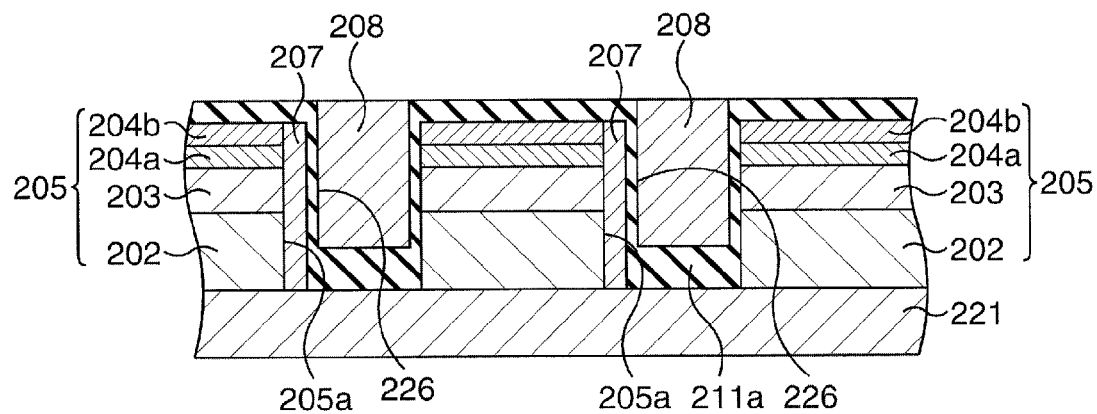
FIG. 7D is a sectional view illustrating the modification example subsequent to FIG. 7C.
Figure 7E:
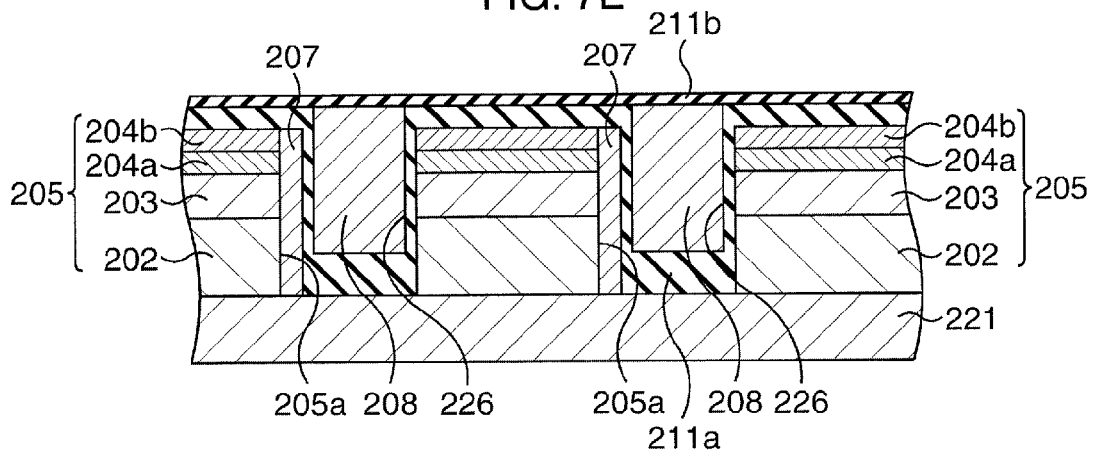
FIG. 7E is a sectional view illustrating the modification example subsequent to FIG. 7D.
Figure 7F:
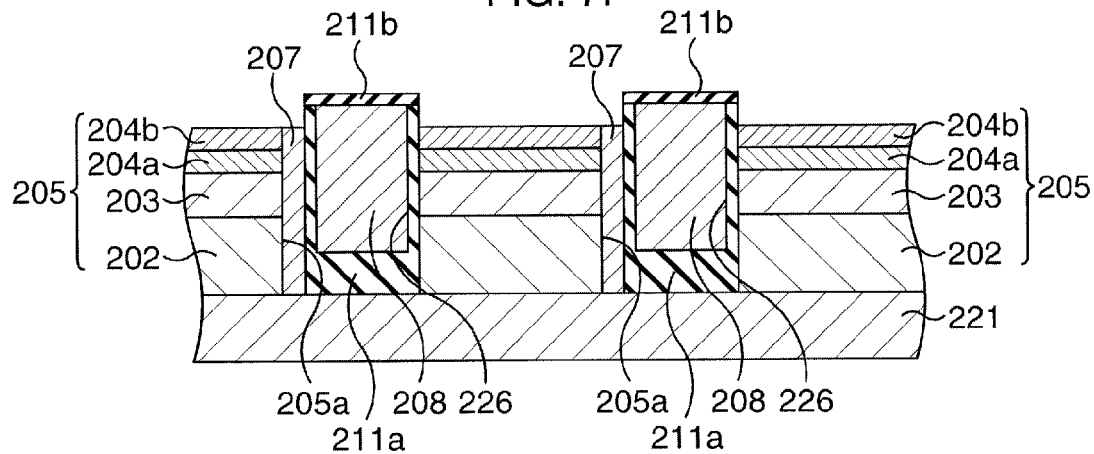
FIG. 7F is a sectional view illustrating the modification example subsequent to FIG. 7E.
Figure 7G:
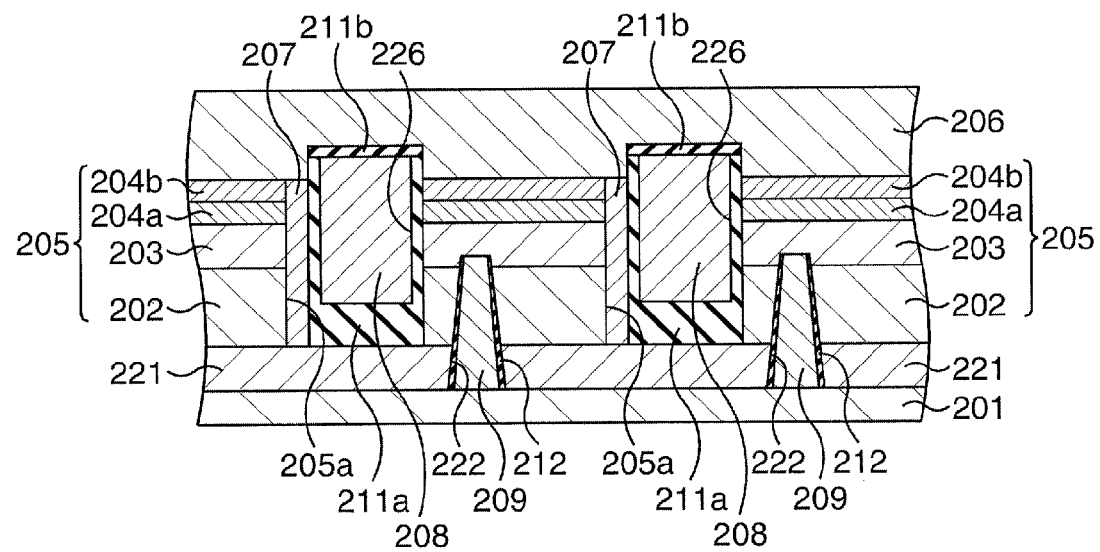
FIG. 7G is a sectional view illustrating the modification example subsequent to FIG. 7F.

Note that the silicon oxide film 252 may be removed after the formation of the AlGaN layer 207, as illustrated in FIG. 7A. In this case, the insulating film 211a is formed after the removal of the silicon oxide film 252, as illustrated in FIG. 7B. Then, the insulating film 211a is processed using the resist pattern 253 as a mask, to thereby form the electrode trench 226 in the insulating film 211a, as illustrated in FIG. 7C. Thereafter, the gate electrode 208 is formed, as illustrated in FIG. 7D. Subsequently, the insulating film 211b is formed, as illustrated in FIG. 7E. At least the n⁺GaN layer 204b and the AlGaN layer 207 are exposed by processing the insulating film 211b and the insulating film 211a, as illustrated in FIG. 7F. Thereafter, the similar processes as the above-stated method are performed, as illustrated in FIG. 7G. In the compound semiconductor device formed by the method as stated above, miniaturization is possible for an extent that the silicon oxide film 252 does not exist.

Figure 8:
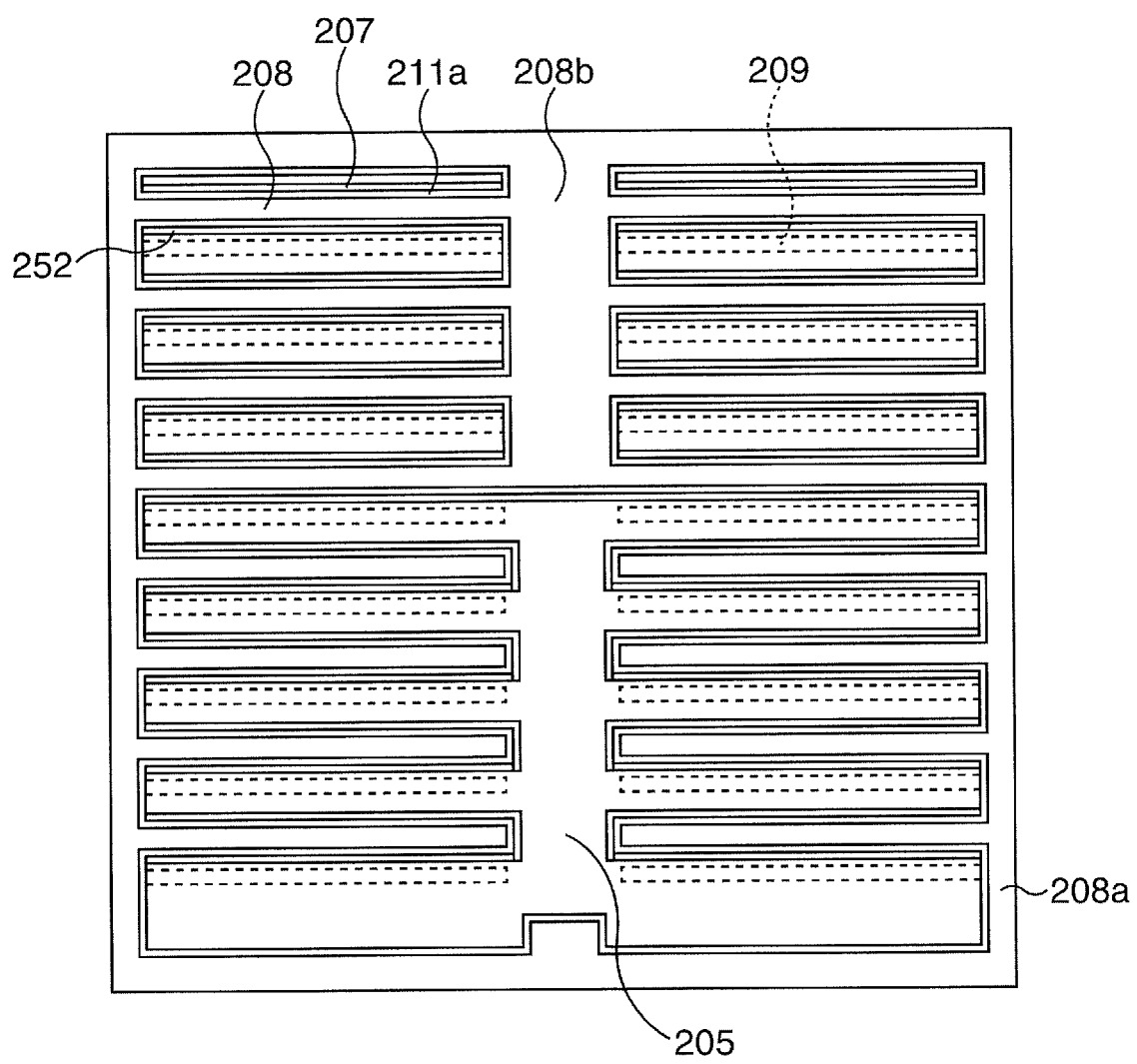
FIG. 8 is a view illustrating a modification example of the second embodiment.

Note that, in the second embodiment, a gate bus line 208b connected to an end portion of a part of the gate electrodes 208 at the other side from the end portion connected to the gate bus line 208a may be provided, as illustrated in FIG. 8. In this case, a signal is transmitted in high speed at the gate electrode 208 which is connected to the gate bus lines 208a and 208b compared to the gate electrode 208 of which one end is not connected to the gate bus line 208b. Accordingly, the former gate electrode 208 is set as an electrode in which a fast signal transmission is required and the latter gate electrode 208 is set as an electrode in which the fast signal transmission is not so much required, and they can be used according to objects thereof.

(Third Embodiment)

Next, a third embodiment is described. In the third embodiment, the source electrode 206 is formed prior to the gate electrode 208. FIG. 9A to FIG. 9F are sectional views illustrating a method of manufacturing a compound semiconductor device according to the third embodiment in process sequence.

Figure 9A:
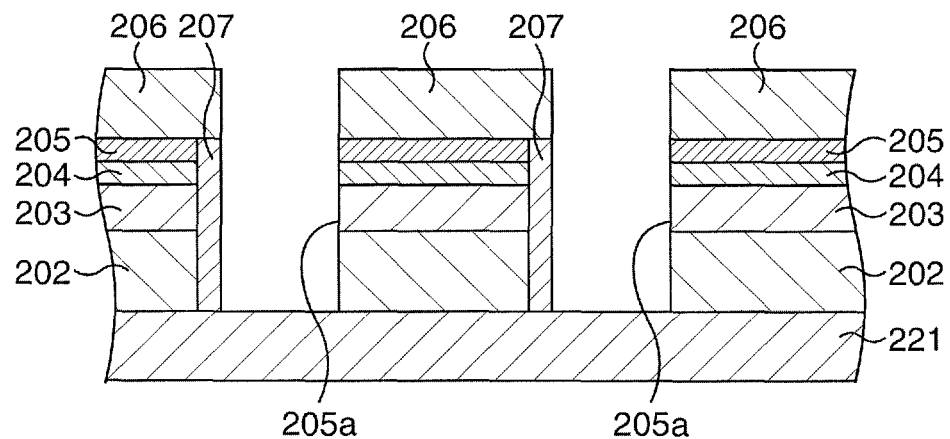
FIG. 9A is a sectional view illustrating a method of manufacturing a compound semiconductor device according to a third embodiment.

First, the processes until the formation of the AlGaN layer 207 are performed (FIG. 5A to FIG. 5D) as same as the second embodiment, further, the silicon oxide film 252 is removed (FIG. 7A). Then, the source electrode 206 is formed on the n⁺GaN layer 204b and the AlGaN layer 207, as illustrated in FIG. 9A. The source electrode 206 may be formed by, for example, a lift-off method.

Figure 9B:
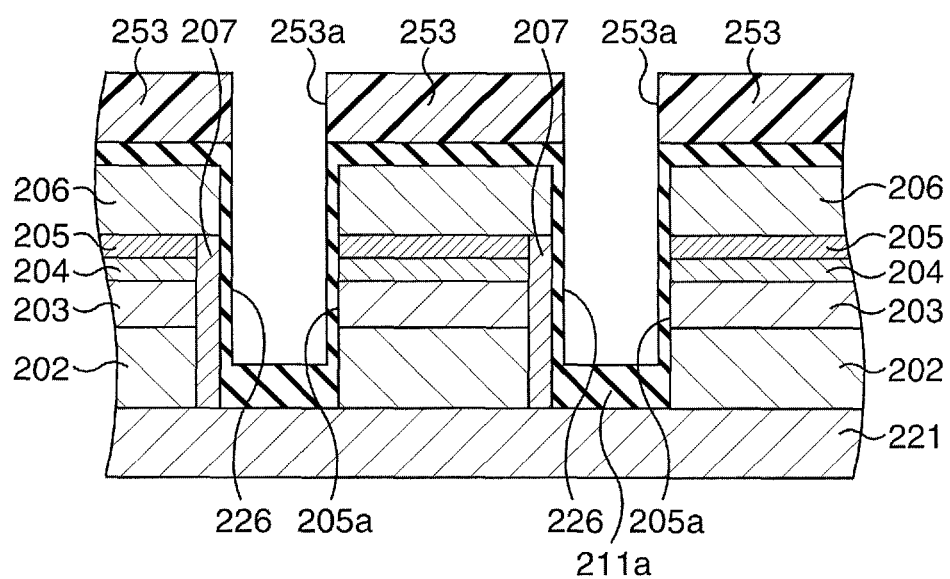
FIG. 9B is a sectional view illustrating the method of manufacturing a compound semiconductor device subsequent to FIG. 9A.

Thereafter, the insulating film 211a is formed on the source electrode 206, and smoothing of the surface is performed, as illustrated in FIG. 9B. Further, the insulating film 211a is processed using the resist pattern 253 as a mask, and thereby, the electrode trench 226 is formed in the insulating film 211a. The formation, the processes and so on of the insulating film 211a may be performed similar to the second embodiment.

Figure 9C:
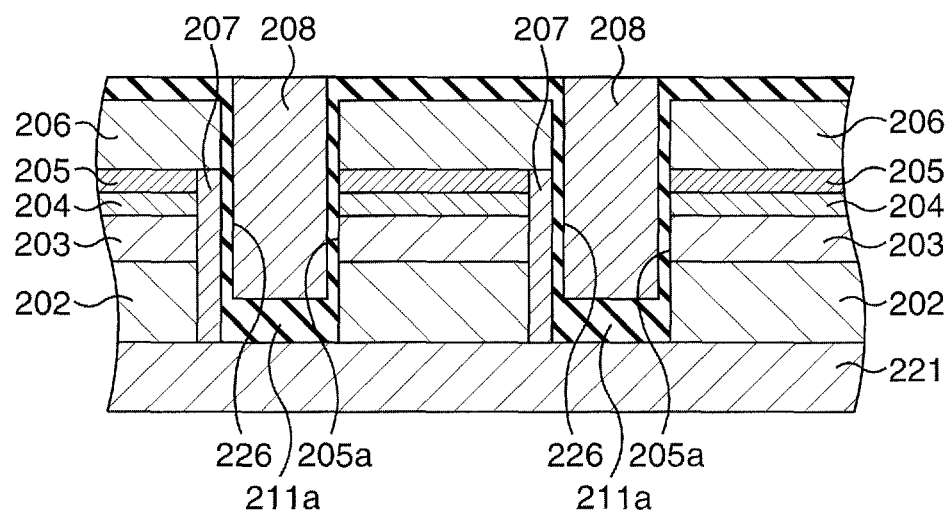
FIG. 9C is a sectional view illustrating the method of manufacturing a compound semiconductor device subsequent to FIG. 9B.

Subsequently, the gate electrode 208 is formed in the electrode trench 226, as illustrated in FIG. 9C. The gate electrode 208 may be formed by, for example, a lift-off method. The resist pattern 253 is also used at the formation time of the gate electrodes 208, and the resist pattern 253 is removed after the formation of the gate electrode 208.

Figure 9D:
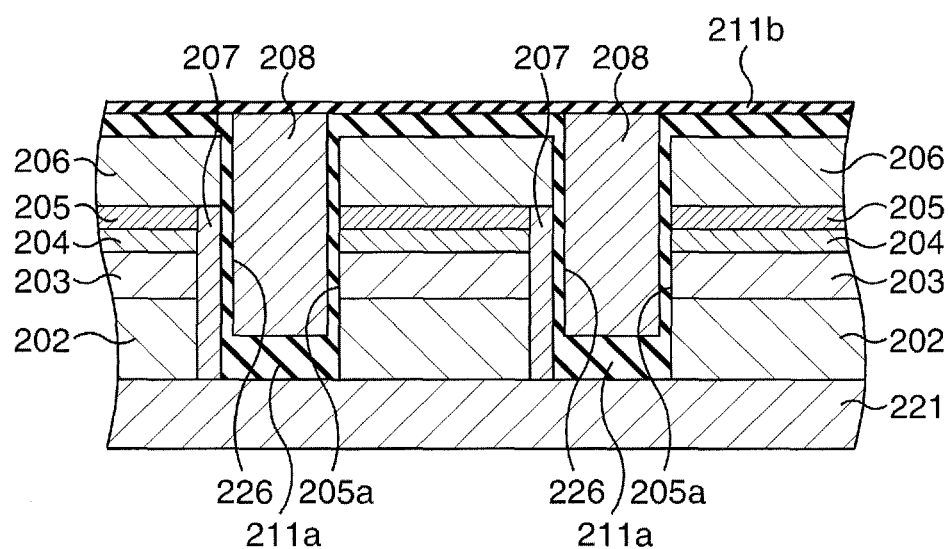
FIG. 9D is a sectional view illustrating the method of manufacturing a compound semiconductor device subsequent to FIG. 9C.

Next, the insulating film 211b covering the gate electrodes 208 is formed over the insulating film 211a, as illustrated in FIG. 9D. The formation of the insulating film 211b may be performed as same as the second embodiment.

Figure 9E:
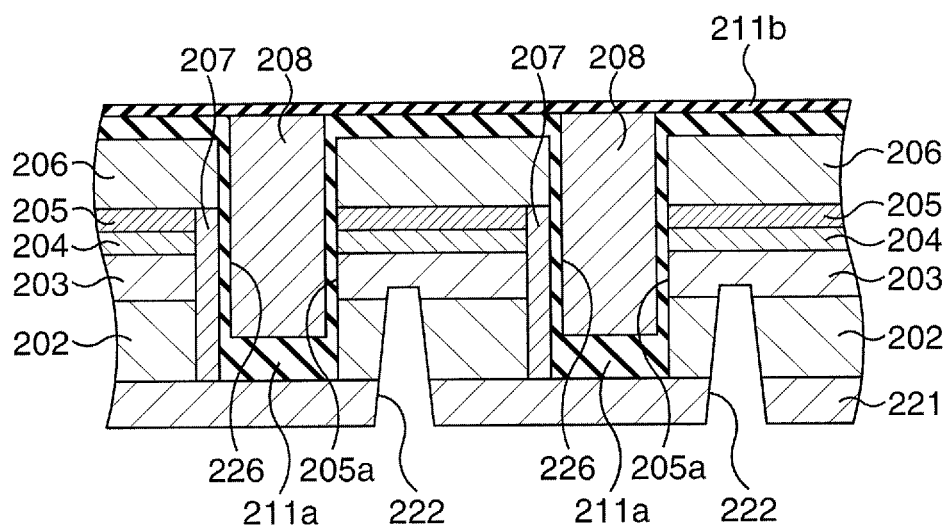
FIG. 9E is a sectional view illustrating the method of manufacturing a compound semiconductor device subsequent to FIG. 9D.

Thereafter, the front surface side of the substrate 221 is covered with a surface protection layer, and the thickness of the substrate 221 is adjusted by polishing the rear surface of the substrate 221, as illustrated in FIG. 9E. Subsequently, the opening 222 reaching the AlGaN layer 203 is formed in the substrate 221 and the GaN layer 202.

Figure 9F:
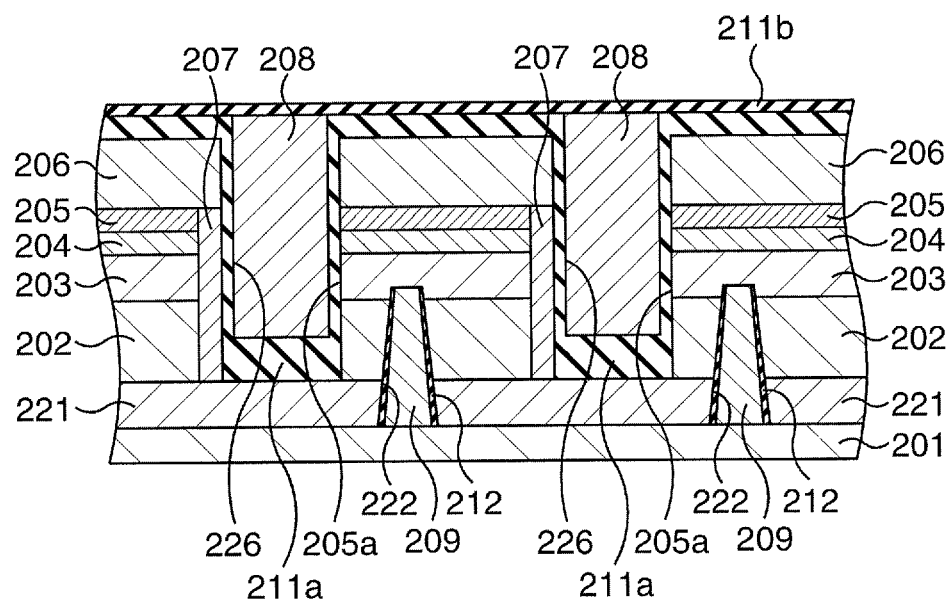
FIG. 9F is a sectional view illustrating the method of manufacturing a compound semiconductor device subsequent to FIG. 9E.

Then, the insulating film 212 is formed at the side surface of the opening 222, as illustrated in FIG. 9F. The electrode 209 is formed in the openings 222, further, the drain electrode 201 is formed on the rear surface of the substrate 221. The formation of the insulating film 212, the formation of the electrode 209, and the formation of the drain electrode 201 may be performed as same as the second embodiment.

The compound semiconductor device according to the third embodiment may be thereby completed.

(Fourth Embodiment)

Next, a fourth embodiment is described. In the fourth embodiment, an insulating film in two-layer structure is formed between the gate electrodes 208 and the substrate 221. FIG. 10A to FIG. 10E are sectional views illustrating a method of manufacturing a compound semiconductor device according to the fourth embodiment in process sequence.

Figure 10A:
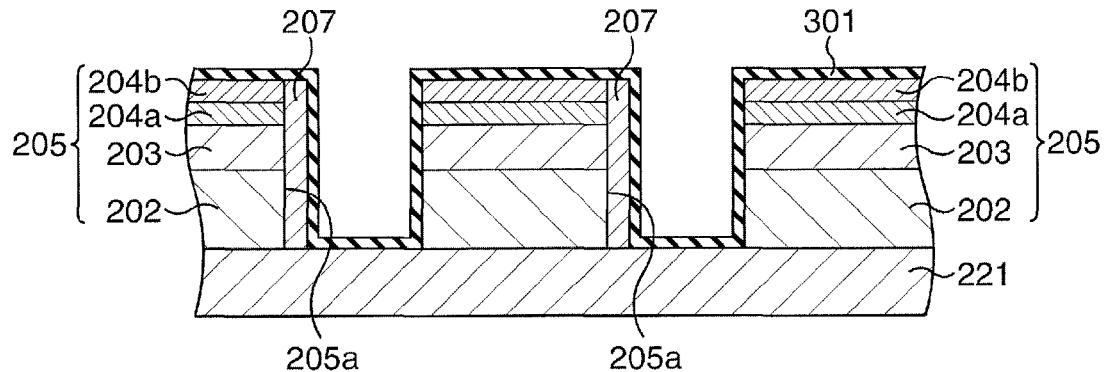
FIG. 10A is a sectional view illustrating a method of manufacturing a compound semiconductor device according to a fourth embodiment.

First, the processes up to the formation of the AlGaN layer 207 are performed (FIG. 5A to FIG. 5D) as same as the second embodiment, further, the silicon oxide film 252 is removed (FIG. 7A). Then, an insulating film 301 is formed over the whole surface, as illustrated in FIG. 10A. A silicon nitride film is formed as the insulating film 301 by, for example, a plasma CVD method, an ALD method, or the like. According to the plasma CVD method or the ALD method, it is possible to isotropically form the insulating film 301 in particular. A thickness of the insulating film 301 may be set to be a thickness suitable for a gate insulating film, and for example, it may be set to be approximately 1 nm to 100 nm. Besides, a hafnium oxide film, a tantalum oxide film, or an aluminum oxide film may be formed instead of the silicon nitride film. Further, two or more kinds from among these four kinds may be stacked to be used.

Figure 10B:
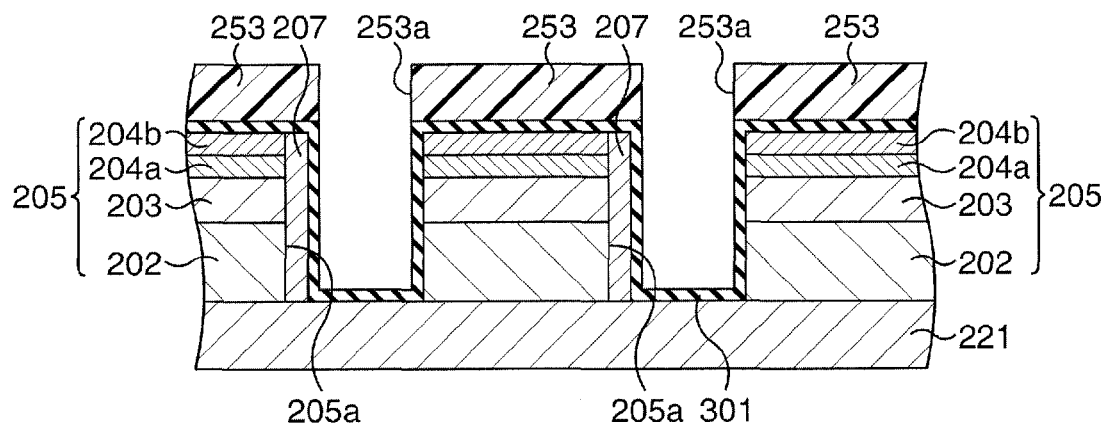
FIG. 10B is a sectional view illustrating the method of manufacturing a compound semiconductor device subsequent to FIG. 10A.

Thereafter, the resist pattern 253 in which the opening 253a is formed at the portion where the gate electrode 208 is to be formed is formed on the insulating film 301, as illustrated in FIG. 10B.

Figure 10C:
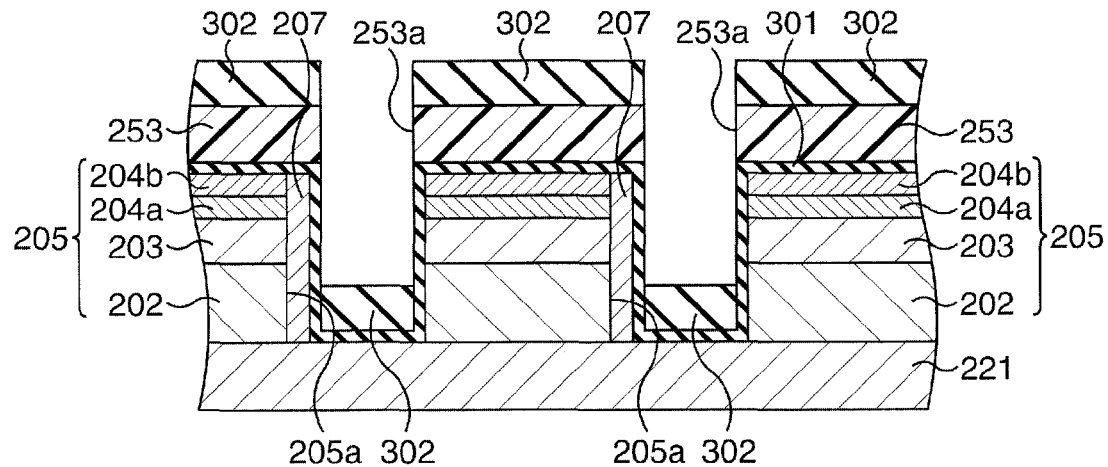
FIG. 10C is a sectional view illustrating the method of manufacturing a compound semiconductor device subsequent to FIG. 10B.

Subsequently, an insulating film 302 is formed on the insulating film 301 and the resist pattern 253, as illustrated in FIG. 10C. A silicon nitride film is formed as the insulating film 302 by, for example, a sputtering method or the like. According to the sputtering method, it is possible to anisotropically form the insulating film 302 in particular. Besides, a hafnium oxide film, a tantalum oxide film, or an aluminum oxide film may be formed instead of the silicon nitride film. Further, two or more kinds from among these four kinds may be stacked to be used.

Figure 10D:
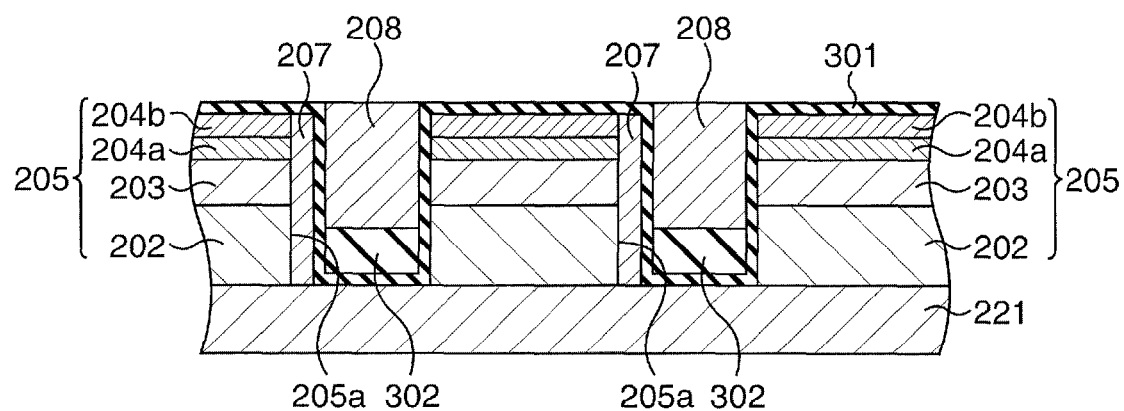
FIG. 10D is a sectional view illustrating the method of manufacturing a compound semiconductor device subsequent to FIG. 10C.

Subsequently, the gate electrode 208 is formed on the insulating film 302 in the opening 205a, as illustrated in FIG. 10D. The gate electrode 208 may be formed by, for example, a lift-off method. The resist pattern 253 is used when the gate electrodes 208 is formed, and removed after the formation of the gate electrodes 208.

Figure 10E:
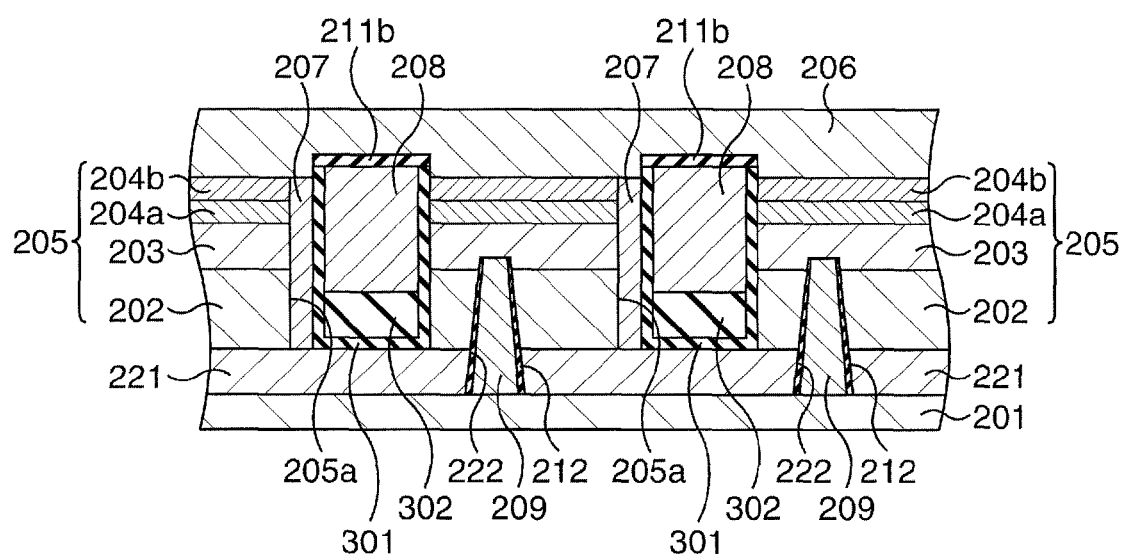
FIG. 10E is a sectional view illustrating the method of manufacturing of a compound semiconductor device subsequent to FIG. 10D.

Thereafter, the formation of the insulating film 211b, the formation of the source electrode 206, the formation of the electrode 209, the formation of the drain electrode 201, and so on are performed as same as the second embodiment, as illustrated in FIG. 10E.

The compound semiconductor device according to the fourth embodiment may be thereby completed.

Note that a thickness of the insulating film 302 may be set to be a thickness suitable for insulation separation between the gate electrodes 208 and the substrate 221, and a total thickness of the insulating films 301 and 302 positioning between the gate electrodes 208 and the substrate 221 is preferable to be similar to the portion 224 of the insulating film 211a in the second embodiment.

The compound semiconductor devices according to the first to fourth embodiments may be used for, for example, a switching semiconductor element. Moreover, the switching element as stated above may be used for a switching power supply or electronic devices. Further, these compound semiconductor devices may be used as components of a full bridge power circuit such as a power supply circuit of a server.

A material for the conductive substrate is not particularly limited as stated above, but it is preferable to select a material for the drain electrode in accordance with the material of the substrate. For example, when a conductive SiC substrate is used, it is preferable to use Ni as the material for the drain electrode, and NiSi, TaSi, WSi, or the like may be used. When a conductive Si substrate is used, it is possible to use Al, TiSi, CoSi, or the like as the material for the drain electrode.

(Fifth Embodiment)

Figure 11:
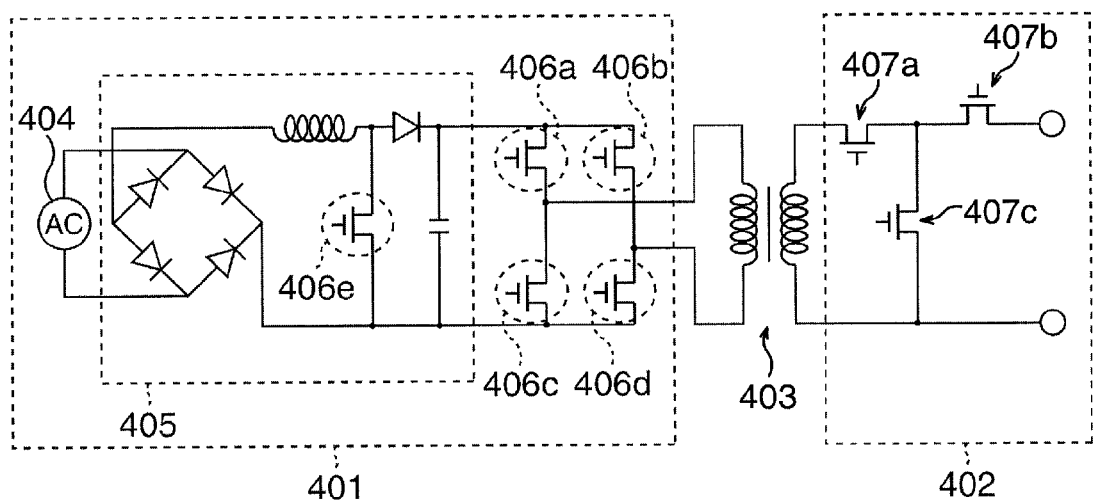
FIG. 11 is a view illustrating a configuration of a power supply device according to a fifth embodiment.

Next, a fifth embodiment is described. The compound semiconductor device according to any one of the first to fourth embodiments is included in a power supply apparatus according to the fifth embodiment. FIG. 11 is a view illustrating a configuration of the power supply apparatus according to the fifth embodiment.

In the fifth embodiment, a high-pressure primary side circuit 401 and a low-pressure secondary side circuit 402 are provided, and further, a transformer 403 is provided between the primary side circuit 401 and the secondary side circuit 402, as illustrated in FIG. 11.

An AC power supply 404, so-called a bridge rectifier circuit 405, and plural (here four pieces of) switching elements 406a, 406b, 406c and 406d are provided in the primary side circuit 401. Besides, a switching element 406e is provided in the bridge rectifier circuit 405. Plural (here three pieces of) switching elements 407a, 407b and 407c are provided in the secondary side circuit 402.

Any one of the first to fourth embodiments is used for the switching elements 406a, 406b, 406c, 406d and 406e. On the other hand, an MIS (metal-insulator-semiconductor) FET using silicon is used for the switching elements 407a, 407b and 407c.

According to the power supply circuit as stated above, it is possible to obtain high reliability, and this power supply circuit is able to be used for, for example, large power use.

(Sixth Embodiment)

Figure 12:
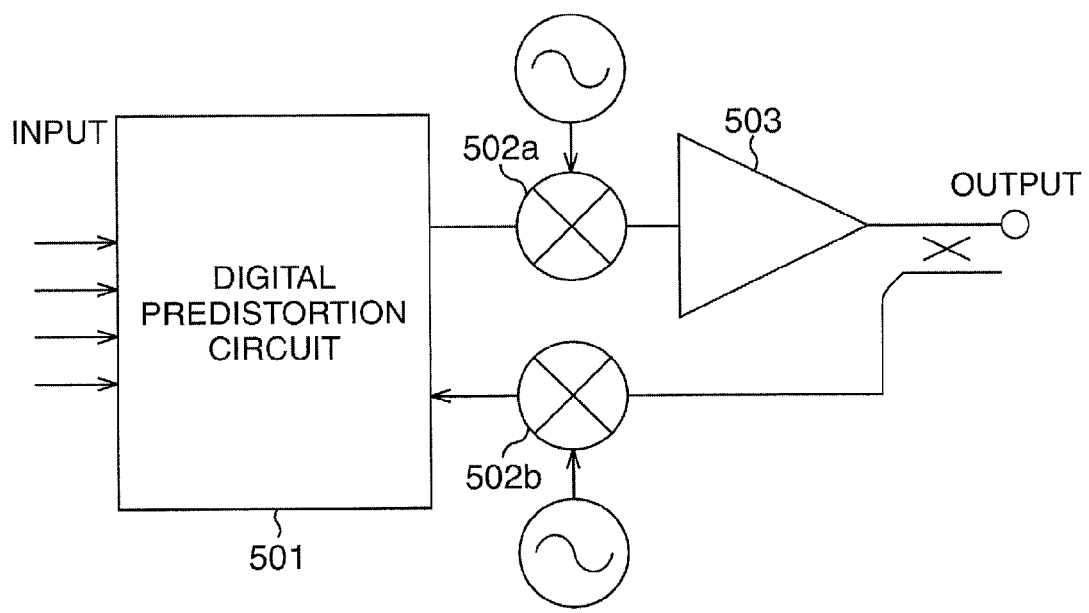
FIG. 12 is a view illustrating a configuration of a high frequency amplifier according to a sixth embodiment.

Next, a sixth embodiment is described. The compound semiconductor device according to any one of the first to fourth embodiments is included in a high-frequency amplifier according to the sixth embodiment. FIG. 12 is a view illustrating a configuration of the high-frequency amplifier according to the sixth embodiment.

In the sixth embodiment, a digital-predistortion circuit 501, mixers 502a and 502b, and a power amplifier 503 are provided, as illustrated in FIG. 12.

The digital-predistortion circuit 501 compensates a nonlinear distortion of an input signal. The mixer 502a mixes the input signal of which nonlinear distortion is compensated and an AC signal. Any one of the first to fourth embodiments is used for the power amplifier 503, and the power amplifier 503 amplifies the input signal mixed with the AC signal. Note that in the present embodiment, it is possible to mix a signal at an output side with the AC signal by the mixer 502b and transmit the signal at the output side mixed with the AC signal to the digital-predistortion circuit 501 by, for example, switching of a switch.

According to the high-frequency amplifier circuit as stated above, it is possible to obtain high-reliability, and the high-frequency circuit is able to be used for, for example, a base station of a cellular phone or a radio communication.

According to these compound semiconductor devices, it is possible to appropriately operate the diode connected to the high electron mobility transistor in the vertical structure.

According to the compound semiconductor device and so on, it is possible to make a diode connected to a high electron mobility transistor in a vertical structure appropriately operate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
    a substrate whose upper surface is a non-polarity surface;
    a first electrode formed over the substrate;
    a first compound semiconductor layer formed over the first electrode;
    a second compound semiconductor layer formed on the first compound semiconductor layer;
    a third compound semiconductor layer formed on the second compound semiconductor layer;
    a second electrode formed over the third compound semiconductor layer;
    a fourth compound semiconductor layer formed in an opening formed in a stack of the first compound semiconductor layer, the second compound semiconductor layer and the third compound semiconductor layer, the fourth compound semiconductor layer being in contact with side surfaces of the first compound semiconductor layer, the second compound semiconductor layer and the third compound semiconductor layer, and the side surfaces facing to the opening;
    a gate electrode that controls an electric potential of an interface between the second compound semiconductor layer and the fourth compound semiconductor layer; and
    a third electrode insulated from the first compound semiconductor layer, the third electrode being in contact with the first electrode and the second compound semiconductor layer, wherein
    a lattice constant of the second compound semiconductor layer is smaller than both of a lattice constant of the first compound semiconductor layer and a lattice constant of the third compound semiconductor layer,
    a lattice constant of the fourth compound semiconductor layer is smaller than both of the lattice constant of the first compound semiconductor layer and the lattice constant of the third compound semiconductor layer, and
    a conduction band energy of the second compound semiconductor layer is higher than a conduction band energy of the third compound semiconductor layer.

2. The compound semiconductor device according to claim 1, wherein the third electrode is formed apart from two-dimensional electron gas generated resulting from a difference of the lattice constants between the first compound semiconductor layer and the fourth compound semiconductor layer and two-dimensional electron gas generated resulting from a difference of the lattice constants between the third compound semiconductor layer and the fourth compound semiconductor layer.

3. The compound semiconductor device according to claim 1, wherein the lattice constant of the second compound semiconductor layer is equal to or less than the lattice constant of the fourth compound semiconductor layer.

4. The compound semiconductor device according to claim 1, further comprising a gate insulating film that insulates the gate electrode and the fourth compound semiconductor layer from each other.

5. The compound semiconductor device according to claim 4, further comprising an insulating film thicker than the gate insulating film, the insulating film insulating the gate electrode and the first electrode from each other.

6. The compound semiconductor device according to claim 1, wherein the first electrode and the third electrode are integrally formed.

7. The compound semiconductor device according to claim 1, wherein
each of the first compound semiconductor layer, the second compound semiconductor layer and the third compound semiconductor layer contains Ga and N, and
each of front surfaces of the first compound semiconductor layer, the second compound semiconductor layer and the third compound semiconductor layer is perpendicular to an a-axis direction.

8. The compound semiconductor device according to claim 1, wherein
each of the first compound semiconductor layer, the second compound semiconductor layer and the third compound semiconductor layer contains Ga and N, and
a plane orientation of each of the side surfaces is (0001).

9. The compound semiconductor device according to claim 1, wherein a resistance of the third compound semiconductor layer at the second electrode side is lower than a resistance of the third compound semiconductor layer at the second compound semiconductor layer side.

10. The compound semiconductor device according to claim 1, wherein
each of the first compound semiconductor layer and the third compound semiconductor layer is a GaN layer or an AlGaN layer, and
each of the second compound semiconductor layer and the fourth compound semiconductor layer is an AlGaN layer containing Al at higher ratio than both of the first compound semiconductor layer and the third compound semiconductor layer.

11. The compound semiconductor device according to claim 4, wherein the gate insulating film comprises at least one kind selected from the group consisting of a silicon nitride film, a hafnium oxide film, a tantalum oxide film and an aluminum oxide film.

12. The compound semiconductor device according to claim 5, wherein the insulating film comprises at least one kind selected from the group consisting of a silicon nitride film, a hafnium oxide film, a tantalum oxide film and an aluminum oxide film.

* * * * *